(12) United States Patent
Gilbert et al.

(10) Patent No.: US 9,570,166 B1
(45) Date of Patent: Feb. 14, 2017

(54) READ OPERATIONS AND CIRCUITS FOR MEMORY DEVICES HAVING PROGRAMMABLE ELEMENTS, INCLUDING PROGRAMMABLE RESISTANCE ELEMENTS

(71) Applicants: Nad Edward Gilbert, Gilbert, AZ (US); Ishai Naveh, San Jose, CA (US); Narbeh Derhacobian, Belmont, CA (US)

(72) Inventors: Nad Edward Gilbert, Gilbert, AZ (US); Ishai Naveh, San Jose, CA (US); Narbeh Derhacobian, Belmont, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/572,646

(22) Filed: Dec. 16, 2014

Related U.S. Application Data

(62) Division of application No. 13/408,797, filed on Feb. 29, 2012, now Pat. No. 8,913,444.

(60) Provisional application No. 61/448,013, filed on Mar. 1, 2011.

(51) Int. Cl.
*G11C 11/00* (2006.01)
*G11C 13/00* (2006.01)
*G11C 11/56* (2006.01)

(52) U.S. Cl.
CPC ......... *G11C 13/004* (2013.01); *G11C 11/5614* (2013.01); *G11C 13/0011* (2013.01); *G11C 2013/0054* (2013.01)

(58) Field of Classification Search
CPC ........... G11C 7/02; G11C 7/18; G11C 11/4091
USPC .................. 365/148, 206, 207, 189.05, 210.1
See application file for complete search history.

(56) References Cited

U.S. PATENT DOCUMENTS

| 7,495,955 | B2* | 2/2009 | Ido | G11C 8/08 365/185.02 |
|---|---|---|---|---|
| 2007/0002630 | A1* | 1/2007 | Gallo | G11C 7/062 365/185.19 |
| 2010/0284213 | A1* | 11/2010 | Savransky | G11C 11/5678 365/163 |

* cited by examiner

*Primary Examiner* — Son Dinh

(57) ABSTRACT

A memory devices and methods can use multiple sense operations to detect a state of memory elements in a marginal state. In some embodiments, an evaluation circuit can generates an output value for a memory element in response multiple sense results for the same memory element.

20 Claims, 17 Drawing Sheets

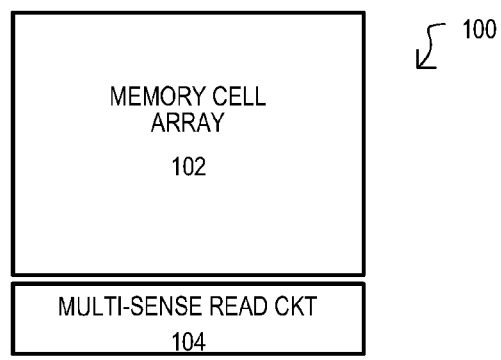
FIG. 1
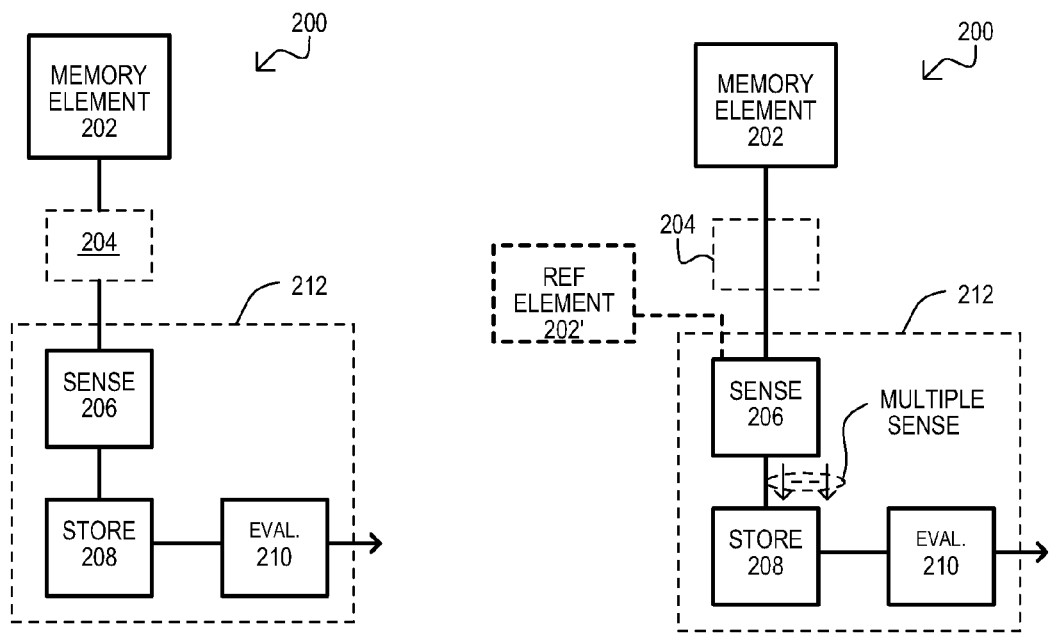
FIG. 2A
FIG. 2B

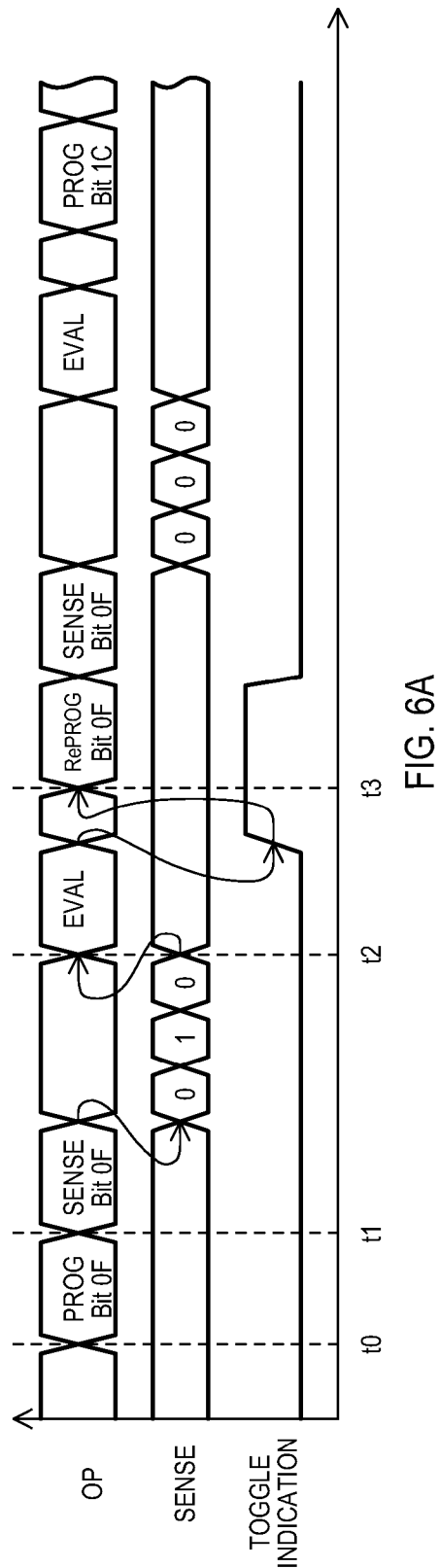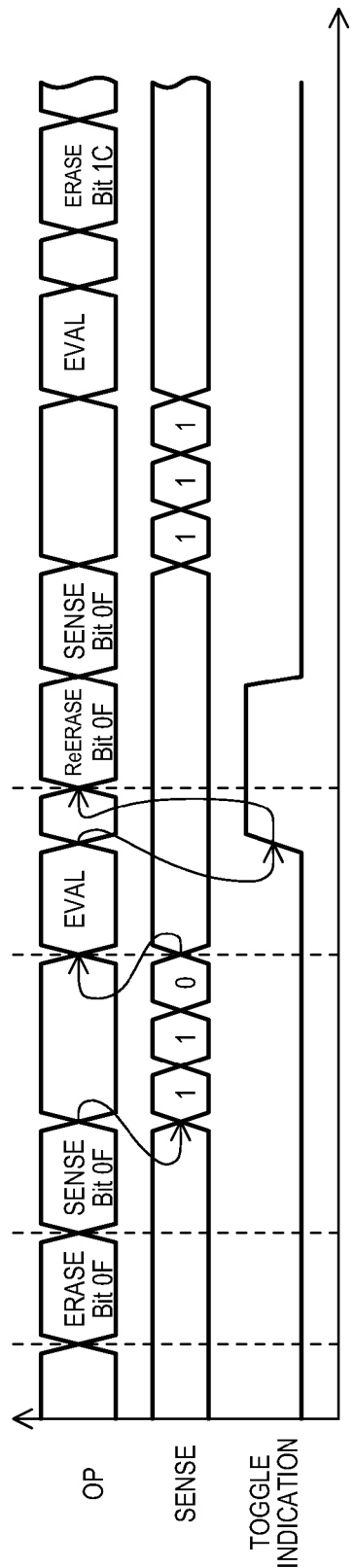

| MAJORITY | |
|---|---|
| SENSED VALUES | OUTPUT READ VALUE |
| 0 0 1 | 0 |
| 0 1 0 | 0 |
| 0 1 1 | 1 |
| 1 0 0 | 0 |
| 1 0 1 | 1 |
| 1 1 0 | 1 |
| 0 0 0 | 0 |
| 1 1 1 | 1 |

FIG. 7A

| MINIMUM (1) | |
|---|---|
| SENSED VALUES | OUTPUT READ VALUE |
| 0 0 1 | 1 |
| 0 1 0 | 1 |
| 0 1 1 | 1 |
| 1 0 0 | 1 |
| 1 0 1 | 1 |
| 1 1 0 | 1 |
| 0 0 0 | 0 |
| 1 1 1 | 1 |

FIG. 7B

| WEIGHTED (1st bit = 1/2, 2nd bit = 2, 3rd bit = 1) | |
|---|---|
| SENSED VALUES | OUTPUT READ VALUE |
| 0 0 1 | 0 |
| 0 1 0 | 1 |
| 0 1 1 | 1 |
| 1 0 0 | 0 |
| 1 0 1 | 0 |
| 1 1 0 | 1 |
| 0 0 0 | 0 |
| 1 1 1 | 1 |

FIG. 7C

| CONDITIONAL MAJORITY (if two consecutive identical stop sensing) | |
|---|---|
| SENSED VALUES | OUTPUT READ VALUE |
| 0 0 X | 0 |
| 0 1 0 | 1 |
| 0 1 1 | 1 |
| 1 0 0 | 0 |
| 1 0 1 | 0 |
| 1 1 X | 1 |
| 0 0 X | 0 |
| 1 1 X | 1 |

X = no sensing

FIG. 7D

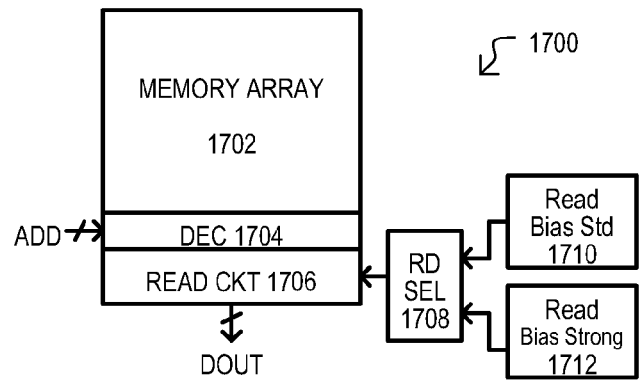
FIG. 17
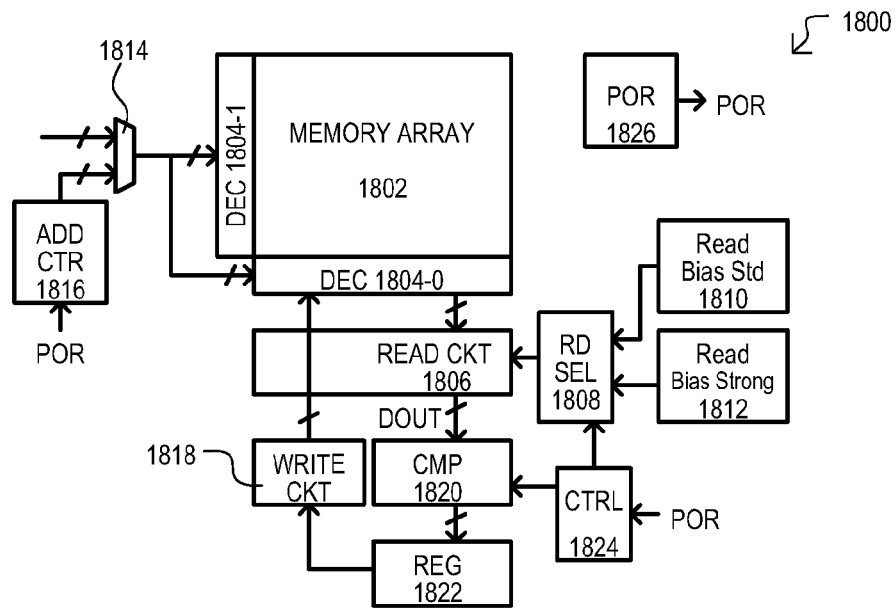
FIG. 18
| | B7 | B6 | B5 | B4 | B3 | B2 | B1 | B0 |
|---|---|---|---|---|---|---|---|---|
| READ Standard | 0 | 0 | 0 | 1 | 1 | 0 | 1 | 0 |
| READ Strong | 0 | 0 | 0 | 1 | 0 | 0 | 1 | 0 |
| Compare | T | T | T | T | 0 | T | T | T |
| Write Data (Bit) | M | M | M | M | 0 | M | M | M |
| Write Data (Byte) | 0 | 0 | 0 | 1 | 0 | 0 | 1 | 0 |
FIG. 19

READ OPERATIONS AND CIRCUITS FOR MEMORY DEVICES HAVING PROGRAMMABLE ELEMENTS, INCLUDING PROGRAMMABLE RESISTANCE ELEMENTS

This application is a divisional of U.S. patent application Ser. No. 13/408,797, filed Feb. 20, 2012, which claims the benefit of U.S. Provisional Patent Application Ser. No. 61/448,013 filed on Mar. 1, 2011, the contents all of which are incorporated by reference herein.

TECHNICAL FIELD

The present disclosure relates generally to memory devices, and more particularly to circuits and methods for reading data values from memory elements, including programmable resistance elements.

BACKGROUND

Memory devices typically include memory elements for storing data. "Flash" electrically erasable and programmable read only memories (EEPROMs) can include an electrical storage gate layer for altering a transistor threshold voltage. Thus, such devices may sense data values based on a transistor threshold voltage.

Devices having one time programmable elements, such as "anti-fuse" elements, can program an element by creating a non-reversible conductive path. Thus, such devices may sense data values based on a static resistance of the cell.

Conventional conductive bridge random access memories (CBRAMs) may include memory elements (sometimes referred to as programmable metallization cells (PMCs)) that may be programmed (or erased) to different resistance levels. Many PMC cells may have a metal-insulator-metal (MIM) structure. In one state (e.g., erased), substantially no current may flow through the MIM structure. In another state (e.g., programmed), a conductive path may be formed through the ion conducting insulator layer. Accordingly, such memory devices may sense data values based on a resistance of a storage element (e.g., PMC).

A drawback to some memory types can be a tendency for memory elements to exhibit a change in property that makes sensing operations inaccurate. That is, a memory element may undergo changes during operation that results in the element exhibiting an erroneous value. Another drawback may arise from sensitive sensing circuits. Such sensing circuits may have difficulty detecting a data values stored by a memory element state, depending upon the operating conditions and state of the memory element. Noise or other effects may result in sense operations occasionally yielding erroneous results.

FIG. 26A is a timing diagram showing a response of a conventional memory device having a PMC element. FIG. 26A shows sensed current Isense and a sense amplifier output SA OUT. A current threshold level Ithresh determines a stored data value. In the embodiment shown, when Isense>Ithresh, an output value SA OUT will be "1". When Isense<Ithresh, an output value SA OUT will be "0".

FIG. 26A shows two sensing periods Tsense0 and Tsense1. As shown, under read conditions a current Isense flowing through a PMC element can, for the most part, stay below Isense. However, during time Tsense1, Isense can rise above Ithresh, due to noise or other effects. A sense amplifier can be sensitive to detecting small changes in current, and thus can output a value "1", when the memory element stores a value "0".

FIG. 26B is a timing diagram showing an undesirable response of a memory element under conventional operations. FIG. 26B include the following waveforms: OP, which show an operation performed on a memory element; ELEMENT R, which shows a sensed resistance of an element; and DATA_OUT, which shows read output data value for the element. In FIG. 26B it is assumed that a programmed element should provide an output data value DATA_OUT of "0".

At about time t0, an element can be programmed (PROG). Such an operation can result in an element resistance (ELEMENT R) being at a relatively low value. At about time t1, a read operation can be performed (READ) that generates an output value based on an ELEMENT_R level. As shown, a sensed ELEMENT R value can be higher than desired. Consequently, a sensed data value is a "1", when a "0" is desired.

In response to such an erroneous read value, an element can be "cycled" through an erase operation at time t3, followed by another program operation at time t4. After such a cycling, an element can have a desired resistance. Thus, at time t5 a READ operation can be performed that yields a correct DATA_OUT value at time t6.

BRIEF DESCRIPTION OF THE DRAWINGS

FIG. 1 is a block schematic diagram of a memory device according to an embodiment.

FIGS. 2A to 2C are block schematic diagrams showing a memory device with multiple sense operations according to an embodiment.

FIGS. 6A to 6C are timing diagrams showing various read operations according to additional embodiments.

FIGS. 7A to 7D are tables showing read data determination methods according to embodiments.

FIG. 17 is a block schematic diagram of a memory device having strong and standard read operations according to an embodiment.

FIG. 18 is a block schematic diagram of a memory device having strong and standard read operations in response to conditions according to an embodiment.

FIG. 19 is a table showing a write operation in response to standard and strong read results according to an embodiment.

DETAILED DESCRIPTION OF THE EMBODIMENTS

Below embodiments show devices, methods and circuits for reading data from a memory device that can improve reliability and/or allow memory elements to have wider response margins than conventional approaches.

In some embodiments, read circuits and methods may account for instability in a read operation by performing multiple sense operations on a same element. A data value may be determined based on such multiple sense operations, rather than a single sense operation.

In other embodiments, read circuits and methods may include both standard read operations and "strong" read operations. A strong read operation can apply more energy to sensed memory element than a standard read operation. Such additional energy may cause a memory element in a marginal state (which may give erroneous data) to switch to a nominal state, and yield correct data values.

According to particular embodiments, write operations may follow from such read operations to reinforce a data state in a memory element that exhibits a change under such read operations.

FIG. 1 is a block schematic diagram showing a memory device 100 according to an embodiment. A memory device 100 can form all or part an integrated circuit, or be realized by a number of integrated circuit devices. A memory device 100 can include a memory cell array 102 and a multi-sense read circuit 104. A memory cell array 102 can include memory cells that each includes one or more programmable elements. Programmable elements can be programmable between different impedance states. Within memory cell array 102, programmable elements can have direct electrical connections to conductive lines (e.g., bit lines, row lines), or can be connected to conductive lines through one or more access devices (e.g., transistors, diodes, thyristor-like elements, etc.).

In very particular embodiments, programmable elements can include an ion conducting layer formed between two electrodes.

Referring still to FIG. 1, a multi-sense read circuit 104 can sense data stored in a same memory cell with multiple sense operations. In some embodiments, a multi-sense read circuit 104 can perform multiple sensing operations on a same memory element and generate a sense result for each such operation. The multi-sense circuit 104 can then generate an output value that is a function of such multiple sense results. In addition or alternatively, a multi-sense read circuit 104 can perform standard read operations and "strong" read operations to a same memory element. Strong read operations can apply more energy to the memory element as compared to standard read operations.

Figure 2C:
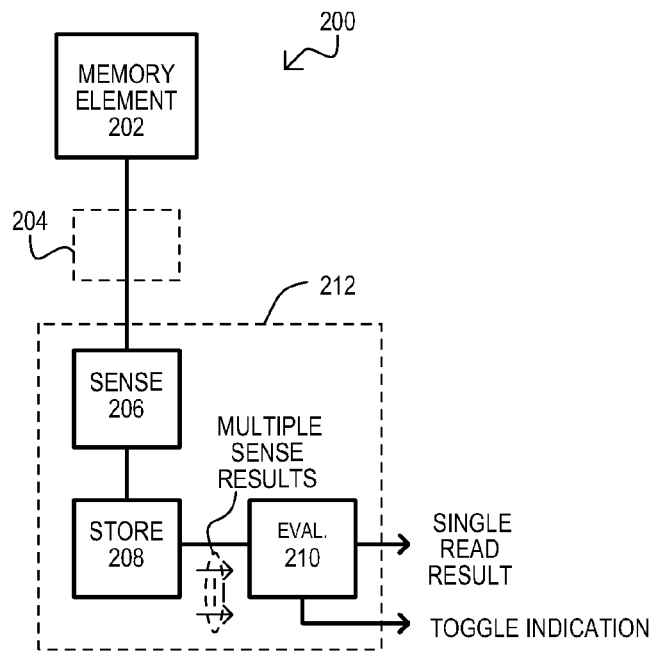

FIGS. 2A to 2C show a memory device 200 and corresponding operations according to another embodiment. A memory device 200 can include one or more memory elements (one shown as 202) accessible by a multi-sense read circuit 212 (referred to herein after as a read circuit). Optionally, a memory element 202 can be connected to a read circuit 212 by a decoded section 204.

A memory element 202 can form part of a larger memory cell array and/or be part of a memory cell having other devices (e.g., an access device). A memory element 202 can have a property that is sensed to determine a data value. In some embodiments, a memory element 202 can store data in binary form, but in other embodiments, a memory element can be a multi-level cell, representing more than two stored data values. A memory element 202 can be a nonvolatile storage element, maintaining its written (e.g., programmed, erased) state regardless of power applied to the memory devices. Alternatively, in some embodiments, a memory element 202 can be volatile, and can lose its written state in the absence of power and/or the absence of a regenerating write operation. A memory element 202 can be programmed between various states multiple times.

As note above, in very particular embodiments, a memory element 202 can be a two terminal element having an ion conducting layer formed between two electrodes. By creation of conductive filaments within the ion conducting layer, a memory element can be programmed between different impedance values.

Optional decoded section 204 can connect a memory element 202 to a read circuit 212 in response to data, such as address data. In some embodiments, a decoded section 204 can connect single columns of memory cells to a read circuit 212, while in other embodiments a decoded section 204 can connect one of a group of columns to a read circuit 212.

A read circuit 212 can include a sense circuit 206, a store circuit 208 and an evaluation circuit 210. A sense circuit 206 can sense a state of a memory element 202 to generate a sense result. It is noted that a memory element 202 can be in a marginal state that can adversely affect sensing results. For example, while a memory element can be in a state that stores one value (e.g., logic "0"), its sensed property can be close that corresponding to another value (e.g., logic "1"). In addition or alternatively, a sense circuit 206 can be sensitive to noise or the like, or can be operating in a noisy environment, and thus can provide sensing results that are occasionally erroneous. In some embodiments, a sense circuit 206 can compare a reference value (e.g., current, voltage, resistance, capacitance) generated by a reference circuit to a value generated from the accessed memory cell 202. In other embodiments, a sense circuit 206 can compare a value generated by a reference element 202' to that generated by the accessed memory element 202. In particular embodiments, a reference element 202' can have the same or a similar structure to the accessed memory element 202.

A store circuit 208 can store sense results from sense circuit 206. More particularly, a store circuit 208 can store multiple sense results for a same memory element. In particular embodiments, a store circuit 208 can store consecutive sense results from a same memory element.

An evaluation circuit 210 can evaluate multiple sense results provided by store circuit 208 to generate a single output read result from such multiple sense results. In the embodiment shown, an evaluation circuit 210 can also provide a "toggle" indication that can be activated when multiple sense results vary from one another.

FIGS. 2B and 2C show a read operation according to one embodiment.

FIG. 2B shows a first part of a read operation according to an embodiment. A memory element 202 can be connected to a sense circuit 206. A sense circuit 206 can evaluate a state of a memory element 202 multiple times, unlike conventional approaches. In one embodiment, such sensing operations can be consecutive with one another. Such multiple sense results can be stored by store circuit 208.

FIG. 2C shows a second part of a read operation according to an embodiment. An evaluation circuit 210 can receive multiple sense results for a same memory element. From such results, an evaluation circuit 210 can generate a single read data value (SINGLE READ RESULT). It is noted that an evaluation circuit 210 can generate a single output read data value according to various techniques. As but a few examples, where sense circuit 206 provides binary sense results, an evaluation circuit 210 can output a majority value from the sense results. Embodiments below will show other methods of generating single read data values.

An evaluation circuit 210 can also provide a toggle indication (TOGGLE INDICATION) that indicates when multiple sense results vary from one another.

In this way, a memory device can generate a single output value based on sensing a state of a memory element multiple times.

Figure 3:
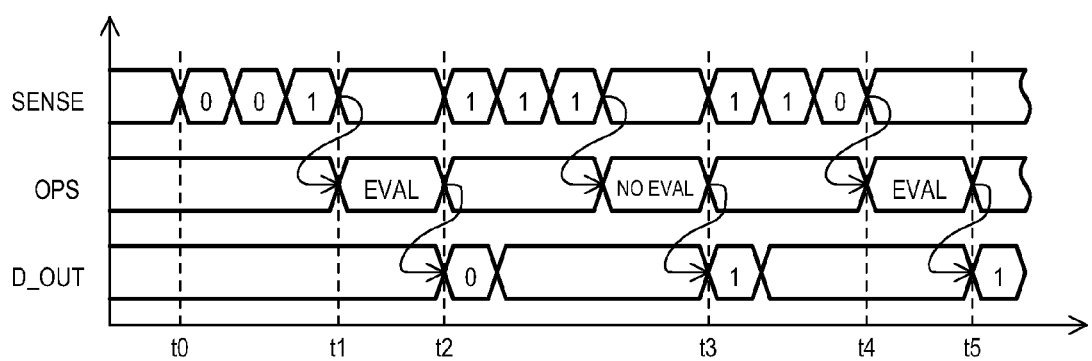
FIG. 3 is a timing diagram showing a multiple sense read operation according to an embodiment.

FIG. 3 is a timing diagram showing one very particular example of a "majority" sense operation according to an embodiment. FIG. 3 shows three waveforms.

Waveform SENSE shows sensing results, such as those generated by a multi-sense circuit. Waveform OPS show actions performed by a memory device. D_OUT show a single output data value resulting from the multiple sense operations.

At about time t0, a state of a memory element can be sensed. As shown, sensing operations provide three sense results (0, 0, 1), each corresponding to a sensed state of the same element.

At about time t1, because the sensed results are different, an evaluation operation can be performed. The evaluation operation (EVAL) can generate an output value based on the most prevalent sensed result. Accordingly, an evaluation operation can result in an output data value of "0" at time t2.

At about time t2, a state of another memory element can be sensed. As shown, sensing operations provide three sense results (1, 1, 1), each corresponding to a sensed state of the same element. However, because the sensed values are the same, an evaluation operation may not be performed, and value of "1" can be output. Times t3, t4 and t5 show the same general response as times t0, t1 and t2, respectively. However, in this read operation, multiple sensed results have a majority "1", thus a "1" value can be output at time t5.

While FIG. 3 shows three sense operations on an element, it is understood that such operations show by one embodiment. Alternate embodiments can include greater or fewer numbers of sense operations. Still further, other embodiments can have conditional numbers of sense operations. As but one example, if an initial number of sense operations (e.g., first two) show a same value, no further sense operations can be performed. However, if the initial sense operations yield different results, additional sense operations can be performed.

In this way, a memory device sense a state of a memory element multiple times, and output a majority value of such sense results as a single read data value.

Figure 4:
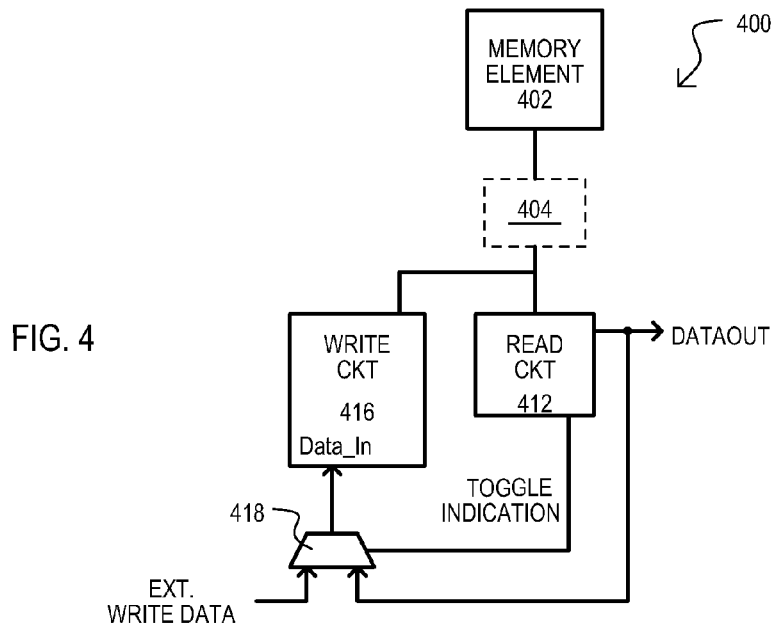
FIG. 4 is a block schematic diagram of a memory device having a multiple sense operation and conditional writing

FIG. 4 is a block schematic diagram showing a memory device 400 according to a further embodiment. Memory device 400 can include one or more memory elements (one shown as 402), a multi-sense read circuit 412 (referred to herein after as a read circuit), a write circuit 416, and a switch circuit 418. As in the case, a memory device 400 can optionally include a decoded section 404.

A memory device 400 can use a sensing operation to detect memory elements in a marginal state, by detecting when multiple sensing operations yield different results. Elements operating in such a marginal state can then be written with data, to reinforce the stored data value.

A memory element 402, decoded section 404, and read circuit 412 can take the forms noted for those shown as 202, 204 and 212 in FIG. 2A, or equivalents.

A write circuit 416 can write a data value to memory element 402 in response to received write data (data at Data_In). In the embodiment shown, a data value received by write circuit 416 can be controlled by a switch circuit 418. In a standard mode of operation, a write circuit 416 can receive write data from a source external to the memory device (EXT. WRITE DATA). However, in a read-recover mode, a write circuit can receive write data from read circuit 412. Such a read-recover mode will now be described in more detail.

In a read-recover mode, a read circuit 412 can perform multiple sensing operations on a same memory element as described for embodiments herein, or equivalents. If such multiple sensing operations "toggle" (i.e., do not all indicate a same data value), read circuit 412 can activate a toggle indication (TOGGLE INDICATION). Further, read circuit 412 can arrive at a single output value (DATAOUT) based on a relationship between such different sensed values.

In response to an active TOGGLE INDICATION, output data DATAOUT can be provided as write data to write circuit 416. In response, write circuit 416 can write such data back into the memory element, thereby "reinforcing" the data state of the memory element. Accordingly, data from a memory element that can have a marginal data state can still be read, however, such a read operation can be followed by a write operation that places the memory element into a nominal state, "recovering" its stored data value.

It is understood that a write operation can take any form suitable for a given memory element. In particular embodiments, write operations can apply voltage biases across a memory element to establish a data state. In some embodiments write operations can occur in a random access fashion, writing data values to only particular data locations of interest. However in other embodiments, such write operations can include sector-type accesses, in which a large group of memory cells can be written to one state substantially simultaneously, followed by selectively writing of a second data state to elements of the sector based on write data.

In this way, a memory device can perform write operations to a memory element in response to multiple sense operations indicating different data states.

Figure 5A:
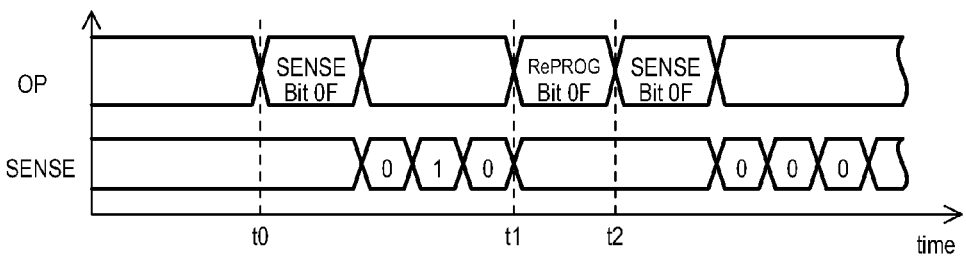
FIGS. 5A to 5C are timing diagrams showing various read operations according to embodiments.
Figure 5B:
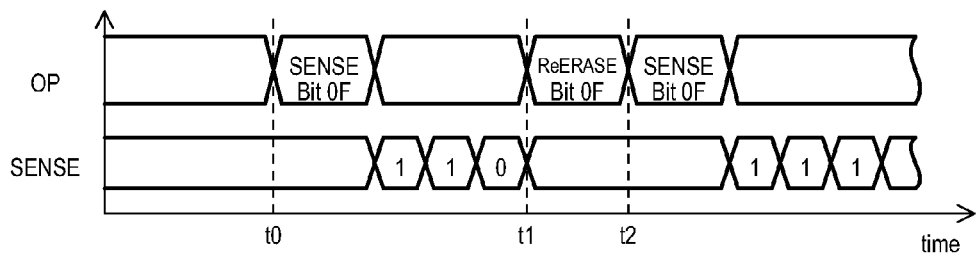
Figure 5C:
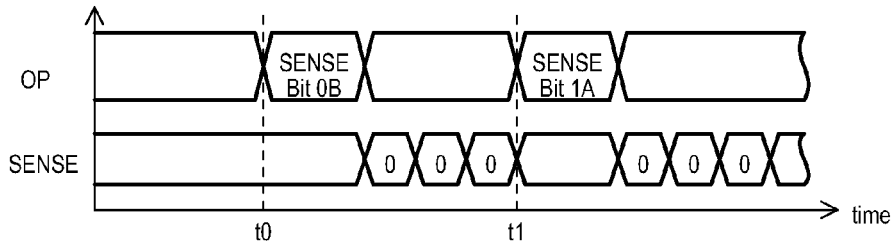

FIGS. 5A to 5C are timing diagrams showing read operations according to particular embodiments. The embodiments shown assume that memory elements can be written to binary values with program operations that write a "0", and erase operations that write a "1". However, as noted above, alternate embodiments can include multi-level memory elements that store more than two data states. Further, which logic values (i.e., 0 or 1) correspond to a particular operation (i.e., erase or program) can vary in other embodiments.

FIGS. 5A to 5C show two waveforms: OP, which shows an operation performed by a memory device; and SENSE, which shows multiple data states of a same memory element sensed by a sense circuit.

Referring now to FIG. 5A, an operation that "recovers" a programmed bit in a read operation is shown in a timing diagram. At about time t0, a sense operation senses a state of a memory element at bit location 0F. As shown in waveform SENSE, sensed results are 0, 1, 0. Because these values are not all the same, at time t1, the bit location can be subject to a re-program (RePROG) operation. Such an operation can reinforce the "0" state in the element of bit 0F. At time t2, a follow-on SENSE operation is performed. All sensed values are now the same (0, 0, 0) indicating the RePROG operation has placed the element into a less marginal state.

It is noted that a RePROG operation can be the same as a program operation utilized to initially establish a data state. Alternatively, a RePROG operation can be at a lower or higher energy level than such an initial program operation.

Referring now to FIG. 5B, an operation that "recovers" an erased bit in a read operation is shown in a timing diagram. FIG. 5B shows the same general operations as FIG. 5A. However, in this case sensed results are 1, 1, 0. Consequently, the bit location can be subject to a "Re-erase" operation (ReERASE). Such an operation can reinforce the "1" state in the element of bit 0F. As in the case of the RePROG operation, a ReERASE operation can be the same as an erase operation utilized to initially establish a data state. Alternatively, a ReERASE operation can be at a lower or higher energy level than such an initial erase operation.

Referring now to FIG. 5C, operations that do not include read recovery are shown in a timing diagram. At about time t0, a sense operation senses a state of a memory element at bit location 0B. As shown in waveform SENSE, sensed results are all the same (0, 0, 0). Accordingly, a RePROG or ReERASE operation is not executed, and a next bit location (Bit 1A) can be sensed at time t1.

Figure 6C:
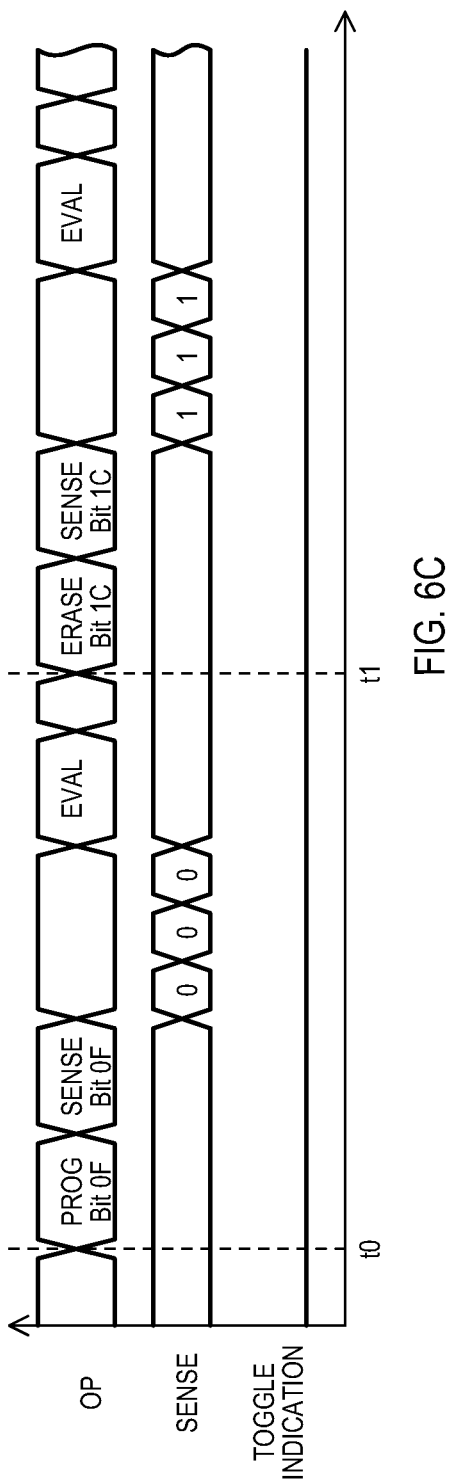

FIGS. 6A to 6C are timing diagrams showing write verify operations according to additional embodiments. As in the case of FIGS. 5A to 5C, the embodiments shown assume that memory elements can be written to binary values with program operations that write a "0", and erase operations that write a "1". However, as noted above alternate embodiments can include multi-level memory elements that store more than two data states or other naming conventions.

FIGS. 6A to 6C show three waveforms: OP and SENSE, which are described above for FIGS. 5A to 5C, and TOGGLE INDICATION, which shows a toggle indication that can be active when sensed values do not match one another.

Referring now to FIG. 6A, a write-verify operation that utilizes a TOGGLE INDICATION is shown. At about time t0, a memory element corresponding to bit 0F is subject to a program operation (PROG). At about time t1, a sense operation senses a state of the memory element at bit location 0F. As shown in waveform SENSE, sensed results are 0, 1, 0. At about time t2, such sense values are evaluated by an evaluation operation (EVAL), which activates a TOGGLE INDICATION.

In response to the active TOGGLE INDICATION, at about time t3 a RePROG operation is executed on the bit once again. At about time t4, another SENSE operation is performed. However, this time all sensed results are the same (0, 0, 0). Consequently, TOGGLE INDICATION is not activated, and a program operation can move on to a next bit location (Bit 1C).

Referring now to FIG. 6B, another write-verify operation that utilizes a TOGGLE INDICATION is shown. FIG. 6B shows the same general operations as FIG. 6A, but for an erase operation. Starting at time t0, a Bit 0F can be erased. At about time t1, multiple sense operations can take place. At about time t2, an evaluation operation (EVAL) shows that the sensed results are different and a TOGGLE INDICATION can be activated. In response to the active TOGGLE INDICATION, at about time t3, "re-erase" operation (ReERASE) can occur.

Referring to FIG. 6C, write verify operations are shown in which re-program and re-erase operations are not performed. At about time t0, a memory element corresponding to bit 0F is subject to a program operation (PROG), as in the case of FIG. 6A. However, unlike FIG. 6A, sensed results are all 0s, indicating an adequate programming. Consequently, a TOGGLE INDICATION is not activated, and a re-program operation does not occur. A method can then move on to a next bit (Bit 1C).

At about time t1, a memory element corresponding to bit 1C is subject to an erase operation (ERASE), as in the case of FIG. 6B. However, unlike FIG. 6B, sensed results are all 1s, indicating an adequate erase. Consequently, a TOGGLE INDICATION is not activated, and a re-erase operation does not occur. A method can then move on to a next bit.

As in FIGS. 5A to 5C, a Re-PROG/Re-ERASE operation can be the same as the preceding PROG/ERASE operation, or can be at a lower or higher energy level than such an initial operation.

In this way, a memory device can perform multiple sense operations after a write operation to verify a data state of a memory element.

FIGS. 7A to 7D are tables showing different possible read data determination methods according to various embodiments. It is stressed that FIGS. 7A to 7D represent but a few of many possible approaches. Alternate sensing approaches can include more or fewer sense results (e.g., two or greater than three). Further, any suitable logical combination of sense values can be utilized to generate a read data output value according to circuit performance, operating conditions, or other factors.

FIG. 7A shows a "majority" data determination approach. According to such an approach, a most prevalent sensed result is determined to be the read data value. As noted above, other embodiments can include determining a majority from a larger number of sense results.

FIG. 7B shows a "minimum" data determination approach. According to such an approach, if multiple sense results include a minimum number of one sense result (in this case the minimum is one sense result of "1"), the output data value will be that number. As noted above, other embodiments can include determining a minimum number from a larger number of sensed results (e.g., 2 of 5, etc.).

FIG. 7C shows a "weighted" data determination approach. According to such an approach, different sensed results will have larger weights than others. In the particular example shown, a first value has a weight of %, a second value has a weight of 2, and a last value has a weight of 1. If a total value is greater than 1.75, an output value can be determined to be a "1", and is otherwise "0". Other embodiments can include different weighting, different threshold determinations (i.e., lower or greater than 1.75), more bits, etc.

FIG. 7D shows a "conditional" data determination approach. According to such an approach, if an initial number sense results meets a threshold (in this case two the same), no further sense operations are performed. FIG. 7D also shows a majority determination. Other embodiments can include different criteria for concluding a sensing operation.

In this way, a memory device can use various approaches to arrive at one read output value from multiple sensed results.

Embodiments above have shown memory devices and methods in which a write operation (e.g., re-program, re-erase) can occur in a read operation, when data values are being sensed. Embodiments have also shown approaches that utilize multiple sensing to verify bit values following a write operation. Other embodiments can implement re-write operations at a later time than multiple sense operations. Particular embodiments including such operations will now be described.

Figure 8A:
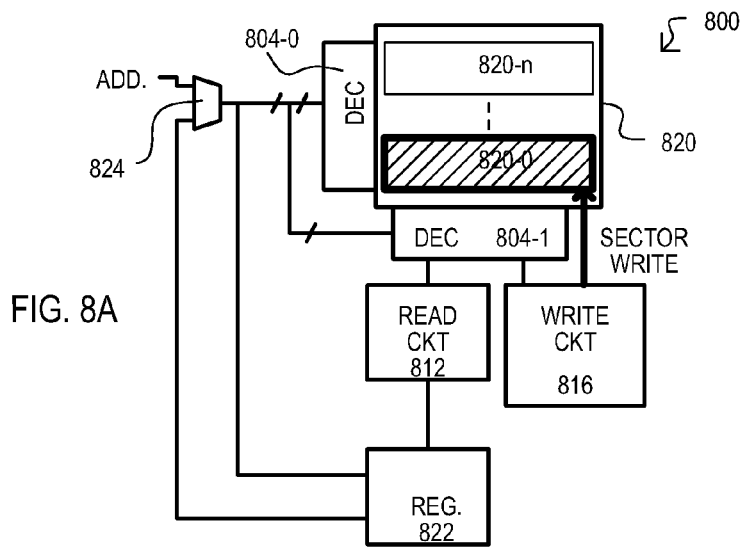
FIGS. 8A to 8C are block schematic diagrams showing a memory device that can verify a sector write with multiple sensing according to an embodiment.
Figure 8B:
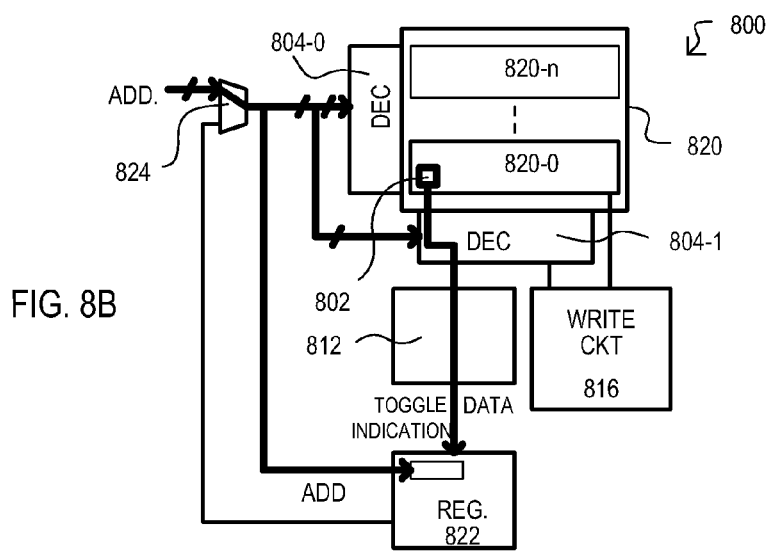
Figure 8C:
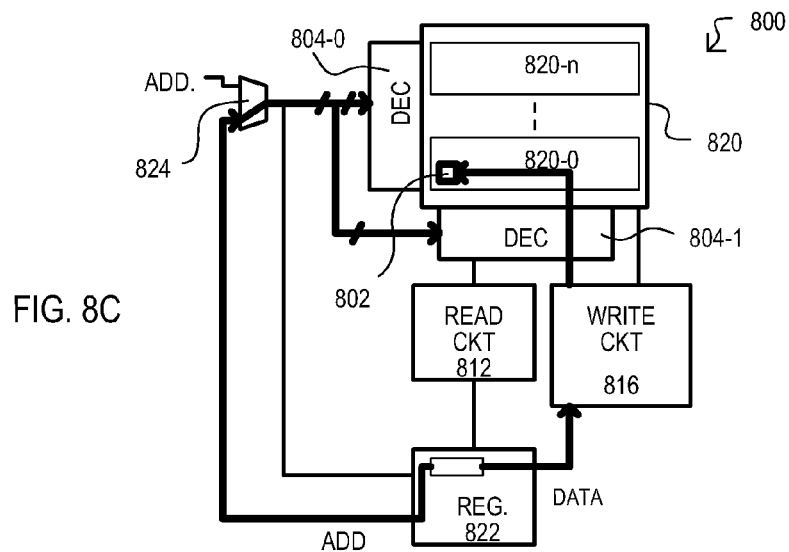

FIGS. 8A to 8C are block schematic diagrams showing a memory device and operations according to additional embodiments. FIGS. 8A to 8C show a memory device in which re-write operations can occur at a different time than initial multi-sense read operation. In particular, locations subject to a re-write operation can be stored, and re-written at a later time.

FIGS. 8A to 8C show a memory device 800 that can include a memory cell array 820, a multi-sense read circuit (hereinafter read circuit) 812, a write circuit 816, a register 822, and an address switch 824. A memory cell array 820 can include a number of memory cells arranged into sectors 820-0 to 820-n. Memory cells within memory cell array 820 can be accessed by address values provided to a row decoder 804-0 and column decoder 804-1. Each of memory cells within memory cell array 820 can include one or more elements programmable between different impedance values.

A read circuit 812 can perform multiple sense operations, and derive single data values from such multiple sense operations, as described in embodiments above, and equivalents. A read circuit 812 can output a read data value (generated from multiple sense operations), as well as a toggle indication TOGGLE INDICATION that indicates when sensed values vary from one another by a predetermined amount.

In the embodiment shown, write circuit 816 can be capable of a "sector" write operation that writes a same value to all memory cells of a sector (i.e., places elements of memory cells into a same state). In addition, a write circuit 816 can write data values to individual locations within a sector. In one very particular embodiment, a write circuit 816 can include a sector "erase" that sets all memory cells within a sector to one value (e.g., "1"). A sector erase can be followed by a program operation, that selectively writes memory cells within a sector to another value (e.g., "0") based in received write data.

A register 822 can store address and data values in response to a toggle indication TOGGLE INDICATION. Thus, a register 822 can store address locations and corresponding data values for memory cells that present marginal sensing responses.

An address switch 824 can provide address values to access locations within memory cell array 820. In the embodiment shown, an address switch 824 can provide addresses from another source (ADD.) to enable data values to be written based on write data from a controller or the like (not shown), or can provide addresses from register 822 to enable the writing of data values stored in the register 822.

Referring now to FIG. 8A, all memory cells within a sector (in this case sector 820-0) can be written with one particular value. Write circuit 816 can access memory cell array 820 and apply write conditions suitable to write a same data value in all locations within the sector 820-0.

Referring now to FIG. 8B, memory cells can be accessed in read operations. FIG. 8B shows a reading of one memory cell 802 by read circuit 812. However, it is understood that multiple such memory cells can be read parallel. In a read operation, an address value can be applied via address switch 824 to row and column decoders (804-0/1) to access memory cell 802. Such an address can also be applied to register 822.

Referring still to FIG. 8B, a read circuit 812 can utilize multiple sense operations, as described above and equivalents, to generate a single read data value, along with a TOGGLE INDICATION. If a TOGGLE INDICATION is active, a read output value along with the corresponding address can be stored in register 822. It is understood that such read operations can occur under various circumstances. For example, in some embodiments, read operations can occur after a sector write operation, and hence serve as a write verification step. In addition or alternatively, read operations can also occur upon predetermined conditions (e.g., power-on, reset). Still further, such read operations can occur in a "background" of a memory device 800 operation, being automatically and/or periodically performed based on number of accesses to a sector, number of writes to sector, a time between a last program of the sector, or other criteria.

Referring now to FIG. 8C, based on addresses and data stored in register 822, data values can be written into memory cells based on addresses and data stored in register 822. FIG. 8C shows a writing of data to memory cell 802 by write circuit 816. An address value from register 822 can be applied via address switch 824 to row and column decoders (804-0/1) to access memory cell 802. In this way, a sequence of addresses and corresponding data values can be written that correspond to memory elements that exhibited different values in multiple sense operations. As in the case of the read operations of FIG. 8B, write operations can occur as part of a verification step. In addition or alternatively, such write operations can occur upon predetermined conditions and/or in a "background" of a memory device 800 operation, as but two examples.

In this way, a memory device can store memory locations of memory elements that have different results in multiple sense operations. Data values can then be re-written into such memory elements at a later point in time.

Figure 9:
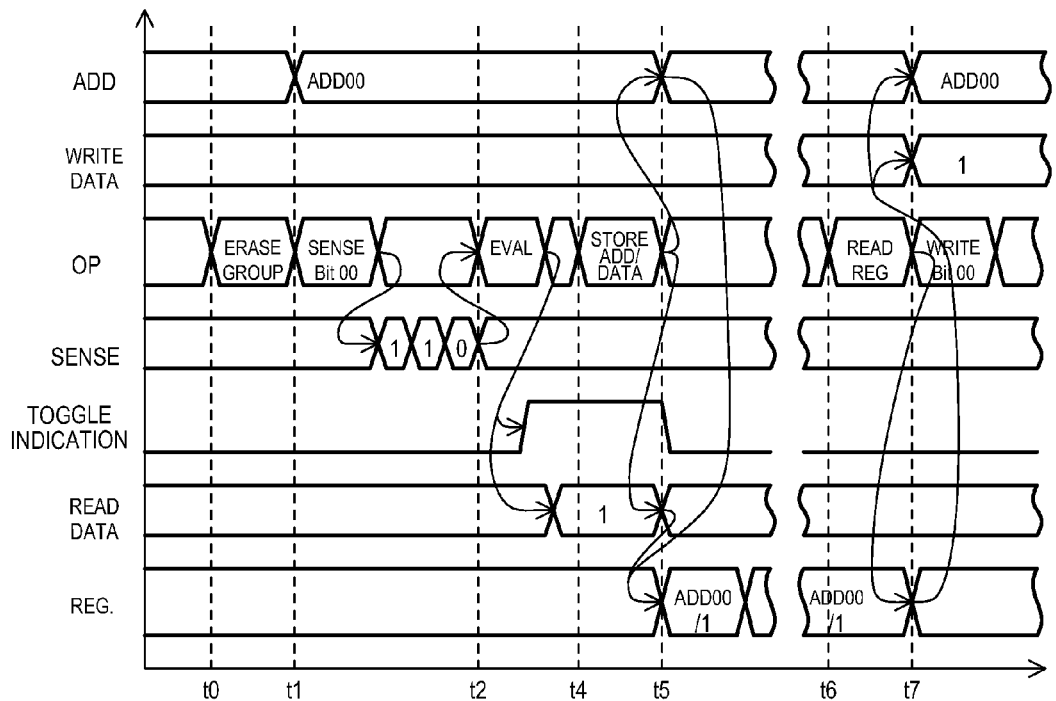
FIG. 9 is a timing diagram showing a sector write with multiple sensing operation according to an embodiment.

FIG. 9 is a timing diagram showing operations according to a further embodiment. FIG. 9 can be one implementation of operations like those shown in FIGS. 8A to 8C.

FIG. 9 shows various waveforms: ADD shows an address being applied to access a memory location, WRITE DATA shows write data applied to a memory location in a write operation; OP shows an operation performed by the memory device; SENSE shows multiple sense results; TOGGLE INDICATION can be a toggle indication as described above (i.e., indicate sense results that are not all the same), READ DATA shows read data derived from multiple sense operations, and REG shows data stored in a register.

Referring now to FIG. 9, at about time t0, a group erase operation can occur. A group erase operation can write a same value to multiple locations of a memory device.

At about time t1, an address (ADD00) can be applied, and multiple sense operations (SENSE Bit 00) can be performed to sense a data value stored in a corresponding memory location.

At about time t2, multiple sense operations can be evaluated (EVAL). Because values are not the same, TOGGLE INDICATION can be activated (driven high in this example). In addition, the multiple values can be evaluated to generate single output READ DATA of "1".

At about time t4, in response to an active TOGGLE INDICATION, a currently applied address (ADD00) and generated data value (1) can be written into register (shown as ADD00/1 at time t5).

In this way, a memory device can store an address of a data location in response to the memory element of such a location generating different multiple sense results.

At about time t6, data and address values stored in a register (ADD00/1) can be read out as an applied address (ADD) and write data value (1).

At about time t7, a write operation can use the address value and data values (ADD00/1) to write the data value into a memory element.

While the embodiments described herein can include memory cells of various types, particular embodiments can include memory cells having elements formed with a mobile ion conducting material. More particularly, embodiments can include programmable metallization cells (PMCs) (also referred to as conductive bridging random access memory (CBRAM) type elements). It is understood that in this description, a "CBRAM element" is not intended to imply any particular memory architecture type (i.e., CBRAM elements can be used in programmable read-only-memory (ROM) type architectures and interfaces, including those compatible with "flash" type memory standards).

Figure 26A:
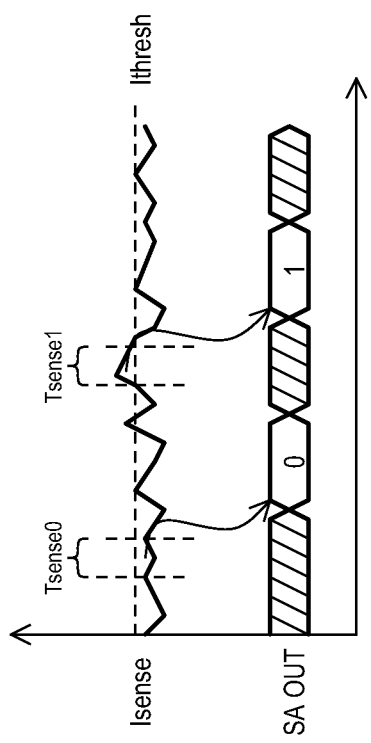
FIGS. 26A and 26B are timing diagrams showing conventional read operations.

Multiple sensing and recovery techniques, as described herein, can enable a memory element to be read accurately as a majority of sensed states will be correct. This is in contrast to a conventional approach, like that of FIG. 26A, which can yield erroneous results.

Figure 10:
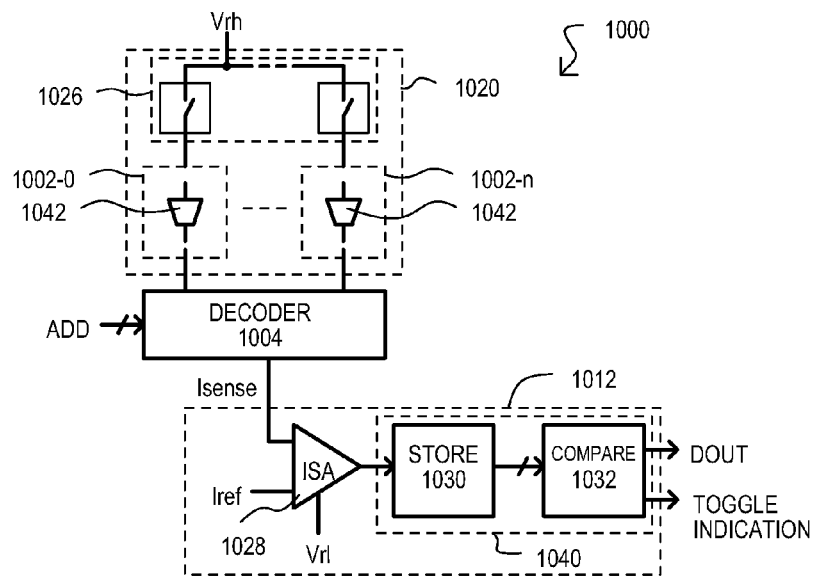
FIG. 10 is a block schematic diagram showing a memory device with multiple current sensing according to an embodiment.

FIG. 10 is a block schematic diagram showing a memory device 1000 according to another embodiment. A memory device 1000 can include a memory cell array 1020, a decoder 1004, and a read circuit 1012.

A memory cell array 1020 can include a read bias circuit 1026 and a number of memory cells 1002-0 to -n, each of which includes one or more PMC elements 1042. PMC elements 1042 can be two terminal elements that can be programmed between at least two resistance states. In a read operation, a read bias circuit 1026 can apply a read bias voltage (Vrh) to terminals of the PMC elements 1042.

A decoder 1004 can selectively connect memory cells (1002-0 to -n) to a read circuit 1012 in response to address values ADD.

A read circuit 1012 can include a current sense amplifier 1028 and an evaluation circuit 1040. A current sense amplifier 1028 can compare a current running through a selected memory cell (1002-0 to -n) to a reference level Iref. In the embodiment shown, operation of current sense amplifier 1028 in combination with read bias circuit 1026 can place a read bias voltage Vrh–Vrl across a PMC element 1042 to cause a current to flow corresponding to a resistance of the PMC element 1042. Evaluation circuit 1040 can include a store section 1028 and a compare section 1030. A store section 1028 can store values corresponding to multiple sense results for a same PMC element 1042. A compare section 1030 can generate a single output value DOUT in response to multiple sense results. A compare section 1020 can determine a single read data value from multiple sense values as described herein or equivalents.

In this way, a memory device can determine a single data value from multiple current readings of PMC element.

Figure 11A:
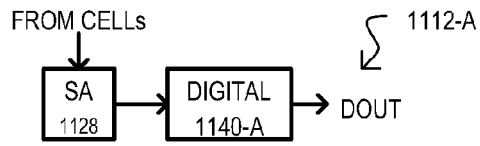
FIGS. 11A and 11B are block schematic diagrams showing read circuits according to embodiments.
Figure 11B:
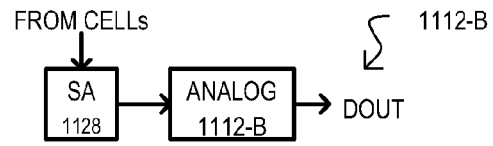

FIGS. 11A and 11B show multiple sense read circuits according to various embodiments. FIG. 11A shows a read circuit 1112-A that can include a sense amplifier 1128 and a digital evaluation circuit 1140-A. A sense amplifier 1128 can be connected to memory cells to sense a state of an accessed memory cell. A sense amplifier 1128 can sense voltage levels, current levels or other electrical signals to derive multiple sense results for a same memory element. A sense amplifier 1128 can output digital sense results to digital evaluation circuit 1140-A.

A digital evaluation circuit 1140-A can include digital circuit to generate a single read data value DOUT from multiple sense values provided by sense amplifier 1128.

FIG. 11B shows a read circuit 1112-B that can include a sense amplifier 1128 and an analog evaluation circuit 1140-B. A sense amplifier 1128 can correspond to that shown in FIG. 11A, or be an equivalent device.

An analog evaluation circuit 1140-B can include analog circuits to generate a single read data value DOUT from multiple sense values provided by sense amplifier 1128.

In this way, a memory device read circuit can include digital and/or analog circuits to generate a single read output value from multiple sense values.

Figure 12A:
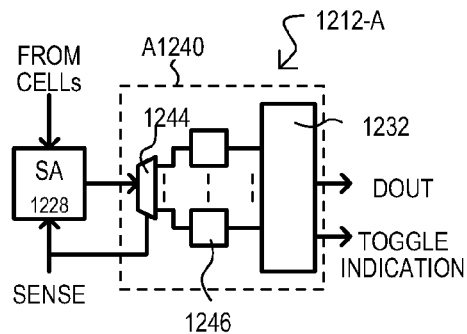
FIGS. 12A and 12B are block schematic diagrams showing read circuits with digital evaluation circuits according to embodiments.
Figure 12B:
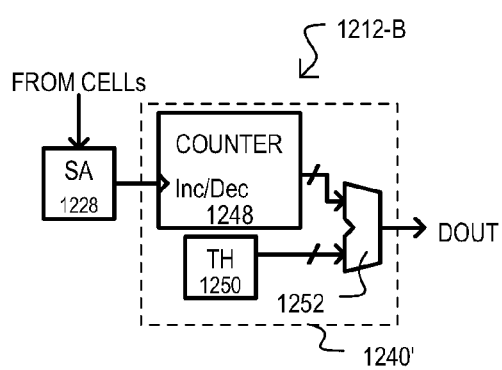

FIGS. 12A and 12B are block schematic diagrams showing particular read circuit embodiments having digital evaluation circuits. It is understood that such embodiments are but two of various possible implementations.

FIG. 12A shows a read circuit 1212-A having a sense amplifier 1228 and a digital evaluation circuit 1240. A sense amplifier 1228 can correspond to that shown in FIG. 11A, or be an equivalent device.

Digital evaluation circuit 1240 can include path control device 1244, storage locations (one shown as 1246), and logic circuits 1232. Path control device 1244 can selectively connect an output from sense amplifier 1228 to different storage locations (e.g., 1246) in response to sense control signals SENSE. Storage locations (e.g., 1246) can store multiple logic values representative of sense results generated by sense amplifier 1228. Logic circuits 1232 can determine a single output value in response to multiple sense results stored in storage locations (e.g., 1246).

FIG. 12B shows a read circuit 1212-B having a sense amplifier 1228 and another digital evaluation circuit 1240'. A sense amplifier 1228 can correspond to that shown in FIG. 11A, or be an equivalent device.

Digital evaluation circuit 1240' can include a counter circuit 1248, a threshold count source 1250, and a digital comparator 1252. A counter circuit 1248 can provide an output count value to comparator 1252 that can be incremented and/or decremented in response to sense results provided by sense amplifier 1228. A digital comparator 1252 can compare a count value from counter circuit 1248 with a digital threshold value from threshold count source 1250 to generate an output value DOUT.

Figure 13:
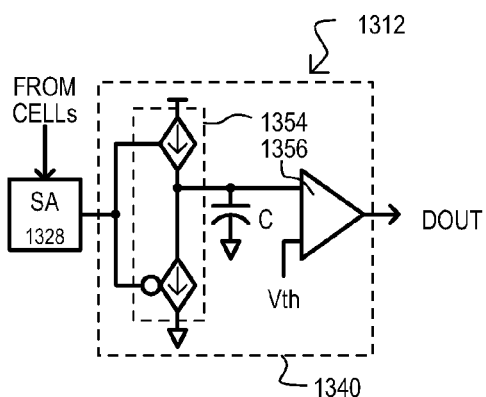
FIG. 13 is a block schematic diagram showing a read circuit with an analog evaluation circuit according to an embodiment.

FIG. 13 is block schematic diagram showing particular read circuit 1312 having an analog evaluation circuit according to an embodiment. It is understood that such embodiments are but one of various possible implementations.

FIG. 13 shows a read circuit 1312 having a sense amplifier 1328 and an analog evaluation circuit 1340. A sense amplifier 1328 can correspond to that shown in FIG. 11A, or be an equivalent device.

Analog evaluation circuit 1340 can include a controllable current source 1354, a capacitor (C), and a differential amplifier 1356. Controllable current source 1354 can selectively charge and/or discharge capacitor C based on a sensed results output from sense amplifier 1328. A differential amplifier 1356 can compare a voltage on capacitor C to a threshold voltage Vth, and based on such a comparison, generate a read data output DOUT.

While embodiments above have shown various methods in conjunction with schematic diagrams, timing diagrams and tables, additional embodiments will now be described with reference to flow diagrams.

Figure 14:
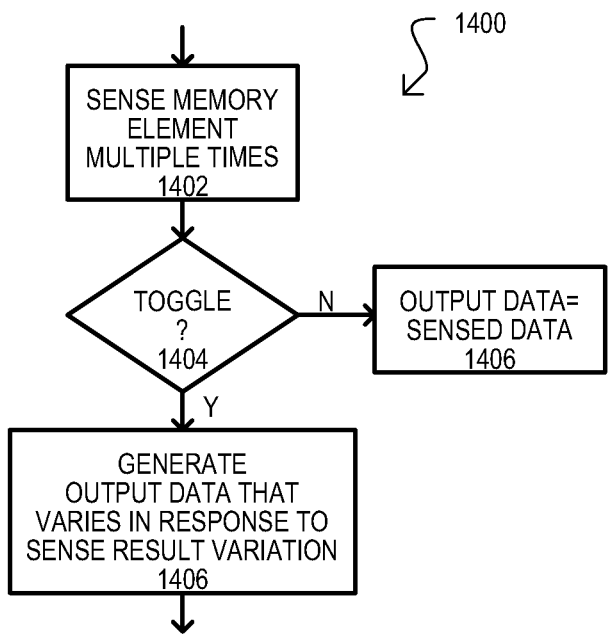
FIG. 14 is a flow diagram of a method according to an embodiment.

FIG. 14 is a flow diagram shows a method 1400 according to an embodiment. A method 1400 can include sensing a memory element multiple times (1402). A method 1400 can check for "toggling" in the multiple sensing of the element (1404). Toggling can include sensing results varying from one another by in a predetermined manner. If a toggling of sense results is not detected (N from 1404), and output value can be the sensed (and non-toggling) result. If toggling of sense results is detected (Y from 1404), output data can be generated that varies in response to the variation in the sense results (1406). In very particular embodiments, such a generation of output data can include any of those shown in FIGS. 7A to 7D, or equivalents.

In this way, read values can be generated in response to multiple sense results.

Figure 15:
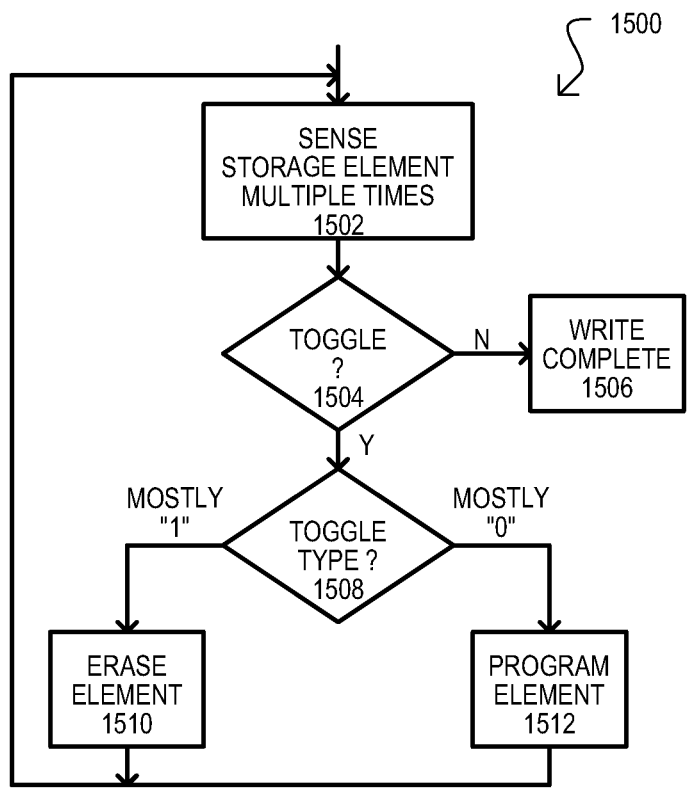
FIG. 15 is a flow diagram of a method according to a further embodiment.

FIG. 15 is a flow diagram showing a method 1500 according to another embodiment. A method 1500 can include sensing a storage element multiple times (1502). Such an action can include applying electrical conditions to a storage element to detect a property of the element multiple times. As in the method of FIG. 14, a method 1500 can check for "toggling" in the multiple sensing of the storage element (1504). If a toggling of sense results is not detected (N from 1504), a write operation can be considered complete for the element (1506).

If a toggling of sense results is detected (Y from 1504), a toggling type can be examined (1508). If sensed values are mostly one value (MOSTLY "1" from 1508), a memory element can be erased (1510). Such an action can include applying biasing conditions to an element that tend to force an element to subsequently provide all 1's in a multiple sense operations. In a similar fashion, if sensed values are mostly another value (MOSTLY "0" from 1508), a memory element can be programmed (1512). Such an action can include applying biasing conditions to an element that tend to force an element to subsequently provide all 0's in a multiple sense operations.

In this way, a method can include writing particular data values to a memory element in the event such an element exhibits toggling in a multiples sense operation.

Figure 16:
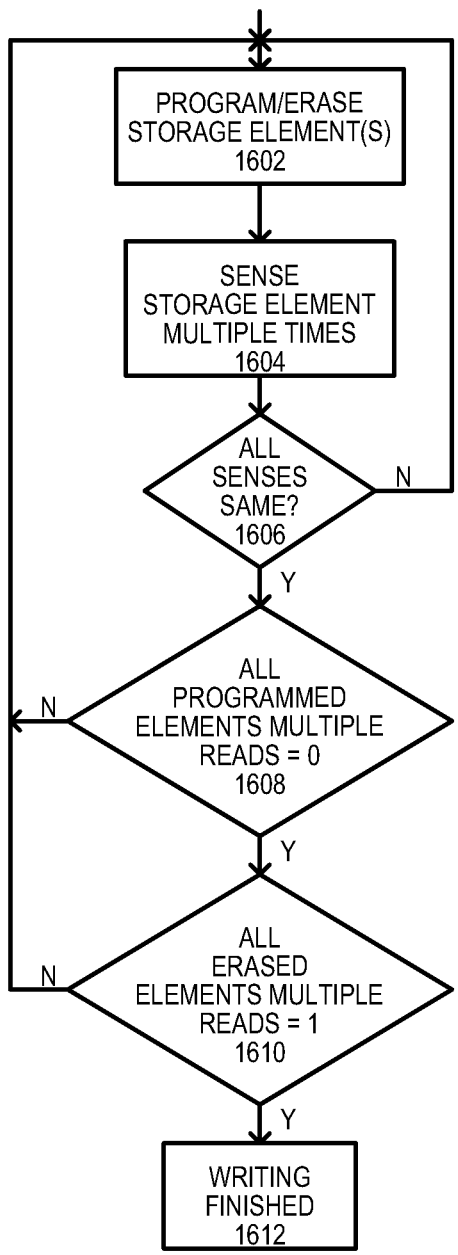
FIG. 16 is a flow diagram of a method according to another embodiment.

FIG. 16 is a flow diagram showing a method 1600 according to a further embodiment. A method 1600 can include programming or erasing storage element(s) (1602). In the embodiment shown, a programming of an element ideally stores a logic "0", while an erasing of an element ideally stores a logic "1".

A storage element can be sensed multiple times (1604). If all sense results are not the same (e.g., toggling is detected) (N from 1606), a method 1600 can return to box 1602, to program or erase elements once again.

If all sense results are the same (e.g., toggling is not detected) (Y from 1606), a method 1600 can confirm that all programmed elements have multiple reads of a same first result (in this case 0) (1608). If all programmed elements have not been adequately programmed (N from 1608), a method 1600 can return to box 1602.

If all programmed elements are determined to be adequately programmed (Y from 1608), a method 1600 can confirm that all erased elements have multiple reads of a same second value (in this case 1) (1610). If all erased elements have not been adequately programmed (N from 1608), a method 1600 can return to box 1602. If all erased elements are determined to be adequately erased (Y from 1610), a writing operation can be finished (1612).

FIG. 17 is a block schematic diagram of a memory device 1700 according to a further embodiment. A memory device 1700 can include a memory array 1702, an optional decoder 1704, a multi-sense read circuit (hereinafter read circuit) 1706, a read select circuit 1708, a standard read bias source 1710, and a "strong" read bias source 1712.

Figure 26B:
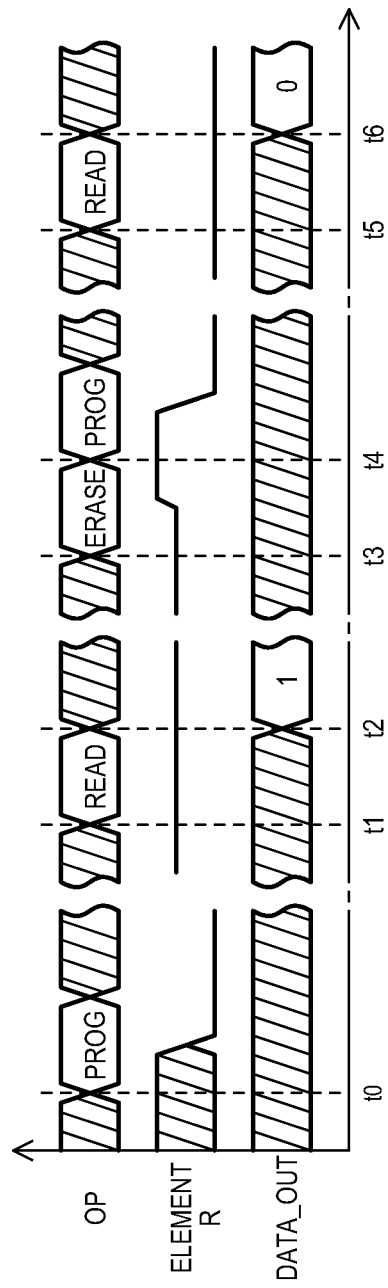

A memory array 1702 can include a number of memory elements that can be susceptible to a response like that of FIG. 26B. That is, a memory element property can drift, or can "stick" at an erroneous level.

An optional decoder circuit 1704 can connect memory elements to read circuit 1706 in response to address values ADD.

A read circuit 1706 can apply read conditions to elements of a memory array 1702 to thereby determine data values stored by such elements. However, unlike conventional read circuits, a read circuit 1706 can be configured to apply different read conditions as supplied from read select circuit 1708.

In the particular embodiment of FIG. 17, a read select circuit 1708 can provide standard read bias conditions from source 1710 or "strong" read bias conditions from source 1712. Strong read bias conditions can apply more energy to an element in a read operation than standard read bias conditions. In response to "strong" read bias conditions, a memory element that has drifted or is "stuck", as described above, can be forced back to its desired response. Strong read bias conditions can also be conceptualized as "weak" write conditions.

In some embodiments, a memory array 1702 can include elements that provide different responses when subjected to a standard read versus a strong read. As but two examples, memory elements can exhibit dynamic changes in impedance that vary according to read bias conditions and/or can exhibit impedance changes that are not linear with respect to applied bias conditions. In such embodiments, read circuit 1706 can adjust threshold voltages to distinguish data values under such different read bias conditions.

In this way, a memory device can read data from memory elements with both standard and strong read bias conditions, where strong read bias conditions can apply more energy to an element than standard read bias conditions.

FIG. 18 is a block schematic diagram of a memory device 1800 according to a further embodiment. A memory device 1800 can utilize a strong read operation in combination with standard read operations to detect memory elements in a marginal state. Such strong and standard read operation can be performed in response to predetermined events (e.g., power-on, reset, wear, "sitting" time). In some embodiments, identified marginal elements can then be written with data to place such elements into a nominal state.

A memory device 1800 can include items like those of FIG. 17, and such like items are referred to by same reference character but with the leading symbols being "18" instead of "17".

Unlike FIG. 17, FIG. 18 shows an address switch 1814, an address counter 1816, a write circuit 1818, a compare circuit 1820, a register 1822, a controller circuit 1824, and a power-on reset circuit 1826. Further, memory array 1802 can be accessed by a row decoder 1804-0 and a column decoder 1804-1.

One mode of operation for memory device 1800 will now be described. In response to a power-on or reset state, power-on reset circuit 1826 can activate an event indication POR. In response to an active POR signal, address counter 1816 can generate a sequence of addresses. Such addresses can be applied to decoders (1804-0/1) by address switch 1814. In response to a received address sequence, decoders (1804-0/1) can couple memory elements within memory array 1802 to read circuit 1806.

In response to an active POR indication, controller circuit 1824 can generate control signals that cause a read select circuit 1808 to first apply standard read bias conditions, followed by strong read bias conditions for each address in a sequence.

A compare circuit 1820 can compare read data generated under standard read bias conditions to read data generated under strong read bias conditions. Differences between such values can indicate a marginal memory element. If such a marginal memory element is detected, a write circuit 1818 can write such a data value back into the memory element. If a compare circuit 1820 does not detect differences between data from a "strong" read and standard read, a memory device can proceed to a next address in a sequence.

Once strong and standard reads (and writes if data values differ) have been performed for a desired address sequence, a memory device 1800 can perform only standard reads until a predetermined event (e.g., power-on, reset, wear, "sitting" time) is detected. A power-on condition can occur when power is first applied to a memory device. A reset condition can reset a memory device to a particular state. Wear can be the number of times a memory element, memory array, or section of a memory array has been programmed. A wear value can indicate just one type of programming (i.e., program or erase cycles), or can indicate both such programming event. A "sitting" time can be the amount of time that has passed since a memory element has been accessed for a read or a write operation.

In this way, in response to certain events and/or conditions, a memory device can perform strong and standard reads to detect marginal bit locations. Write operation can then be performed to such marginal bits to place them back into a nominal state. A memory device can then perform standard reads to read data from memory array.

FIG. 19 is a table showing examples of memory device operations according to embodiments. "READ Standard" shows data values generated under standard read bias conditions. "READ Strong" shows data values generated under standard read bias conditions. "Compare" shows compare results between READ Standard data and READ Strong data.

As shown by the Compare row, a READ Strong data shows that bit B3 changes as compared to the READ Standard data.

Write data can then be generated from the READ Strong data. Such write data can be written back into the memory device to reinforce the proper state for bit B3.

FIG. 19 shows two possible write data options according to embodiments. "Write Data (Bit)" shows data that can be written for a memory device having bit-masking or the like, in which individual bit values can be written. "Write Data (Byte)" shows data that can be written for a memory device that can only write bits in a group (in this case a byte). It is understood that alternate embodiments can write back data in larger or smaller bit groups that include any marginal bit(s) (e.g., nibbles, words, double-words, etc.).

Figure 20:
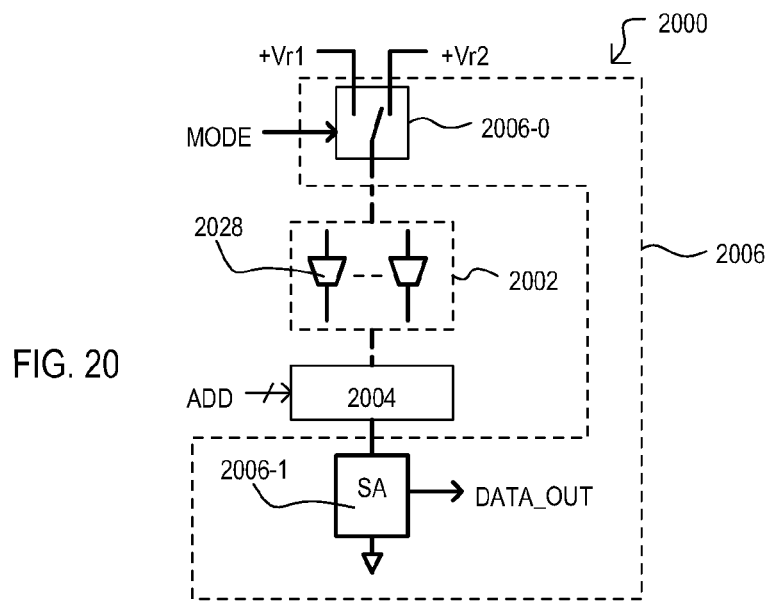
FIG. 20 is a block schematic diagram of a memory device with programmable metallization cell (PMC) type elements according to an embodiment.

FIG. 20 is a block schematic diagram shows a memory device 2000 according to another embodiment. A memory device 2000 can include a read circuit 2006, a memory array 2002 that includes PMC (i.e., CBRAM) memory elements (one shown as 2028), and optionally, a memory array 2002 can be accessed via a decoder 2004. A memory array 2002 can store data values according to an impedance (e.g., resistance) state of PMC element 2028. PMC elements 2028 can include an ion conducting layer formed between two electrodes. One electrode can be an anode electrode that includes a metal that can ion conduct within the ion conducting layer, while the other electrode can be a cathode electrode.

A read circuit 2006 can include read bias circuit 2006-0 and a sense amplifier 2006-1. Read bias circuit 2006-0 can selectively apply a standard read bias voltage (+Vr1) or a strong read bias voltage (+Vr2) in response to a mode signal MODE. Accordingly, in a strong read operation, +Vr2 can be applied to a selected PMC element 2028, while in a standard read operation, +Vr1 can be applied to a selected PMC element 2028. A sense amplifier 2006-1 can sense a resistance of a selected element to generate an output value DATA_OUT.

A decoder 2004 can selectively connect one or more PMC elements (e.g., 2028) to sense amplifier 2006-1 in response to address values.

While FIG. 20 shows an embodiment that includes PMC type elements with a strong read bias that can be conceptualized as a "weak" program bias (i.e., a bias that tends to cause a decrease in element resistance), alternate embodiments can apply strong reads in an opposite fashion. That is, such a strong read could be conceptualized as a "weak" erase bias (i.e., a bias that tends to increase an element resistance). Accordingly, in some embodiments, strong and standard read biases can have a positive polarity in the anode to cathode direction (i.e., weak program), while in other embodiments, strong and standard read biases can have a negative polarity in the anode to cathode direction (i.e., weak erase).

Further, other embodiments can include any other suitable memory element exhibiting such "sticky" bit type response. In one very particular embodiment, memory elements can include phase change memory (PCM) memory cells. A read circuit can apply strong read conditions that can be conceptualized as a "weak" erase bias (i.e., a bias that tends to place the element in an amorphous state).

Figure 21A:
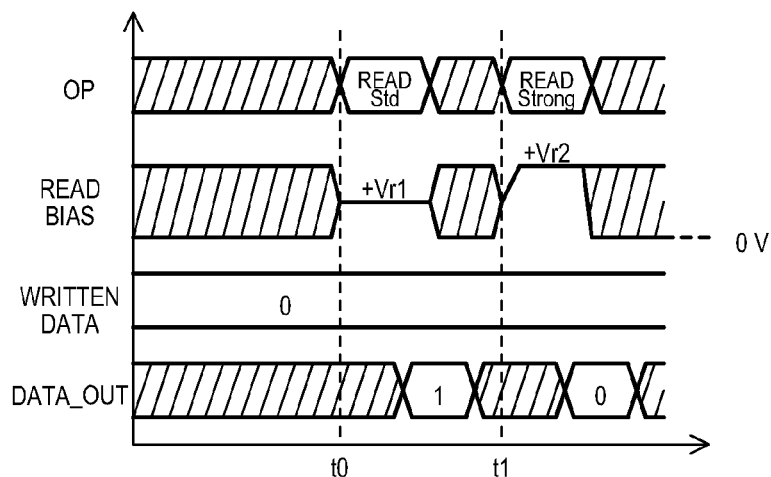
FIGS. 21A and 21B are timing diagrams showing standard and strong read operations according to embodiments.
Figure 21B:
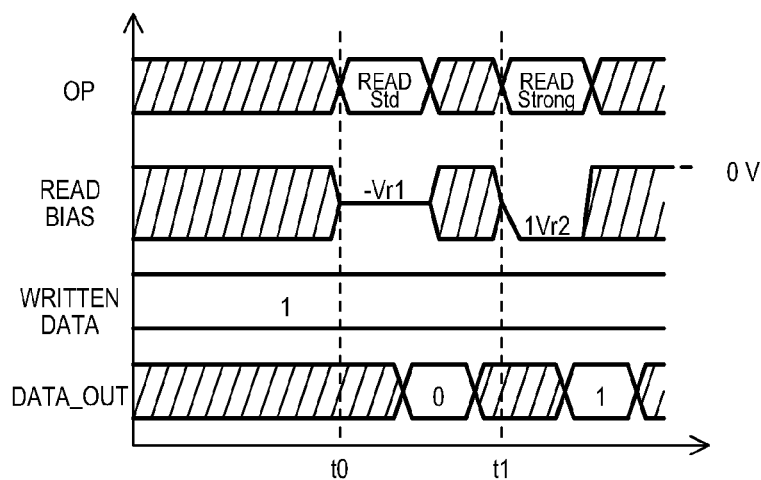

FIGS. 21A and 21B are timing diagrams showing read operations according to embodiments.

FIG. 21A shows a read operation for a memory device like that of FIG. 20. Prior to time t0, a memory element can be programmed to output a data value of "0". In one embodiment, this can include a PMC element being programmed to a relatively low resistance.

At about time t0, a standard read operation can be performed by applying a bias voltage +Vr1 to a selected PMC element. It is assumed that the resistance of the PMC element is too high. As a result, a DATA_OUT value can erroneously be "1".

At about time t1, a strong read operation can be performed by applying a bias voltage +Vr2 to the same selected PMC element. Bias voltage +Vr2 is greater than −FVr1. As shown, in response to the "strong" read conditions, a resistance of the PMC element can be lower, resulting in a DATA_OUT value of "0".

FIG. 21B shows a read method like that of FIG. 21A, however, polarities of the applied bias voltages are reversed. Accordingly, at time t0 a standard read bias voltage of −Vr1 can be applied to a selected element. At time t1, a strong read bias voltage −Vr2 can be applied to the same selected element. The strong read bias voltage results in a DATA_OUT value switching from "0" to "1".

Figure 22:
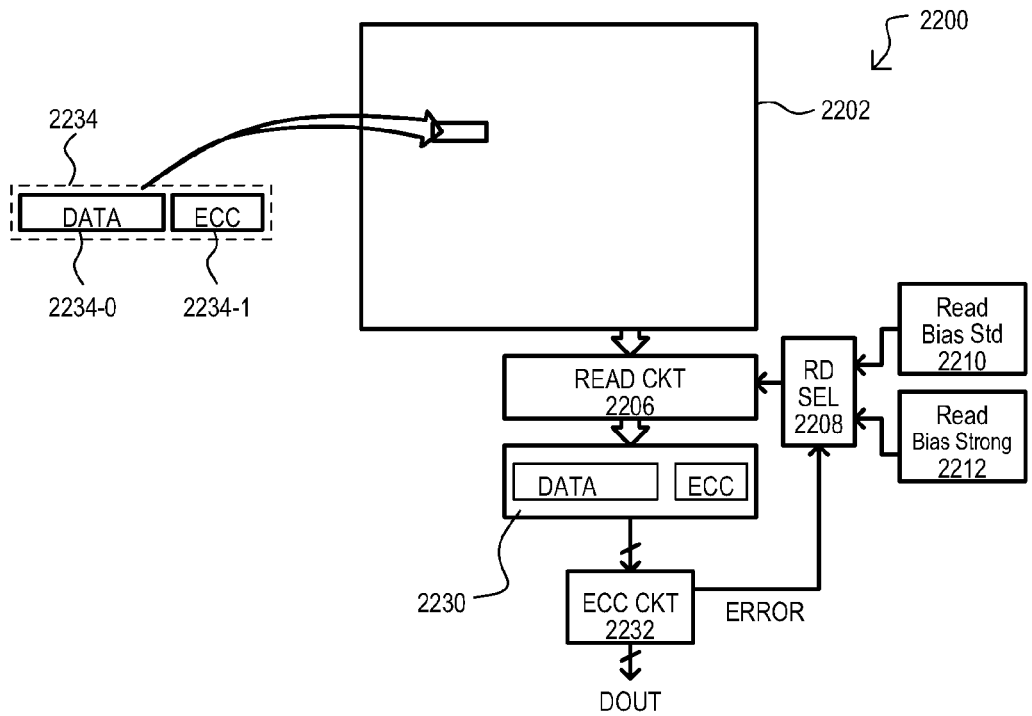
FIG. 22 is a block schematic diagram of a memory device that can perform a strong read operation in response to error correction and/or error detection, according to an embodiment.

FIG. 22 is a block schematic diagram of a memory device 2200 according to a further embodiment. A memory device 2200 can apply a strong read operation based on data error detection and/or correction results. A memory device 2200 can include a memory array 2202, a read circuit 2206, a register 2230, and an error correction/detection circuit 2232. A memory device 2200 can also include a read select circuit 2208 as well as standard and strong read bias sources (2210 and 2212), as described above, and equivalents.

Data within memory array 2202 can be organized into data units (one shown as 2234) that each includes a data value 2234-0 (i.e., data that was written and is to be read) and error correction/detection data (referred to hereinafter as ED/CC data) 2234-1 for the data value. In one embodiment, ED/CC data can enable the detection of errors in a data value. In other embodiments, ED/CC data can enable the detection and correction of errors in a data value, for some maximum number of bit errors.

A read circuit 2206 can be capable of performing standard and strong read operations as described herein, and equivalents. Register 2230 can store read data and corresponding ED/CC data accessed in a read operation.

Read selection circuit 2208 can enable a strong read operation to be performed in response to an active ERROR indication. A read circuit 2206 can then re-read a data value and (e.g., 2234-0) and corresponding ECC data (e.g., 2234-1) under strong read conditions. Such a strong read operation can correct any previous errors, and/or reduce a number of errors to a level correctable by an ED/CC code.

In one embodiment, circuit 2232 can be an error detection circuit, and not provide any error correcting functions. In such an embodiment, in a read operation, a read select circuit 2208 can apply a read bias from standard read bias source 2210. In response, a read data value 2234-0 and corresponding ED/CC data 2234-1 can be output to register 2230. Circuit 2232 can be an error detection circuit, and can activate error indication ERROR if an error is detected in the read data value using the ED/CC data. In response to the active error indication ERROR, a read select circuit 2208 can apply a strong read bias voltage from strong read bias source 2212. Such a strong read bias voltage may correct the detected errors. In this way, a strong read can correct detected errors.

In another embodiment, circuit 2232 can provide error detection and correction functions. In such an embodiment, a read data value 2234-0 and ED/CC value 2234-1 can be read with standard read bias conditions by read circuit 2206. Read data value 2234-0 and ED/CC value 2234-1 can be stored in register 2230. Error correction circuit 2232 can receive such values and perform an initial error detection operation. If no errors are detected in the data by error correction circuit 2232, such data can be output as DOUT. If errors are detected and corrected with the corresponding ED/CC value, the corrected read data value can be output as DOUT. If errors are detected but are not correctable with the corresponding ED/CC code, an error indication ERROR can be activated. In response to such an active indication, the same read data value (and optionally the ED/CC value) can be read with strong bias conditions by read circuit 2206, and operations can proceed in the same fashion as the initial standard read, as described above. In this way, a strong read bias voltage may correct errors that were not correctable with the ED/CC code.

FIGS. 17 to 22 have shown various methods according to embodiments. Additional methods will now be described with reference to flow diagrams.

Figure 23:
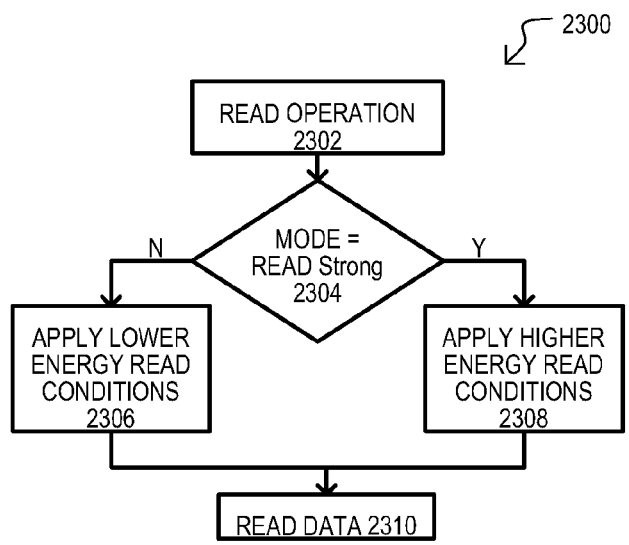
FIG. 23 is a flow diagram of a memory device according to an embodiment.

FIG. 23 is a flow diagram showing a method 2300 according to an embodiment. A method 2300 can include determining a read operation request (2302). If a mode indication does not indicate a strong read (N from 2304), lower energy read conditions can be applied (2306), and data can be read (2310). If a mode indication indicates a strong read (Y from 2304), higher energy read conditions can be applied (2308), and data can be read (2310).

Figure 24:
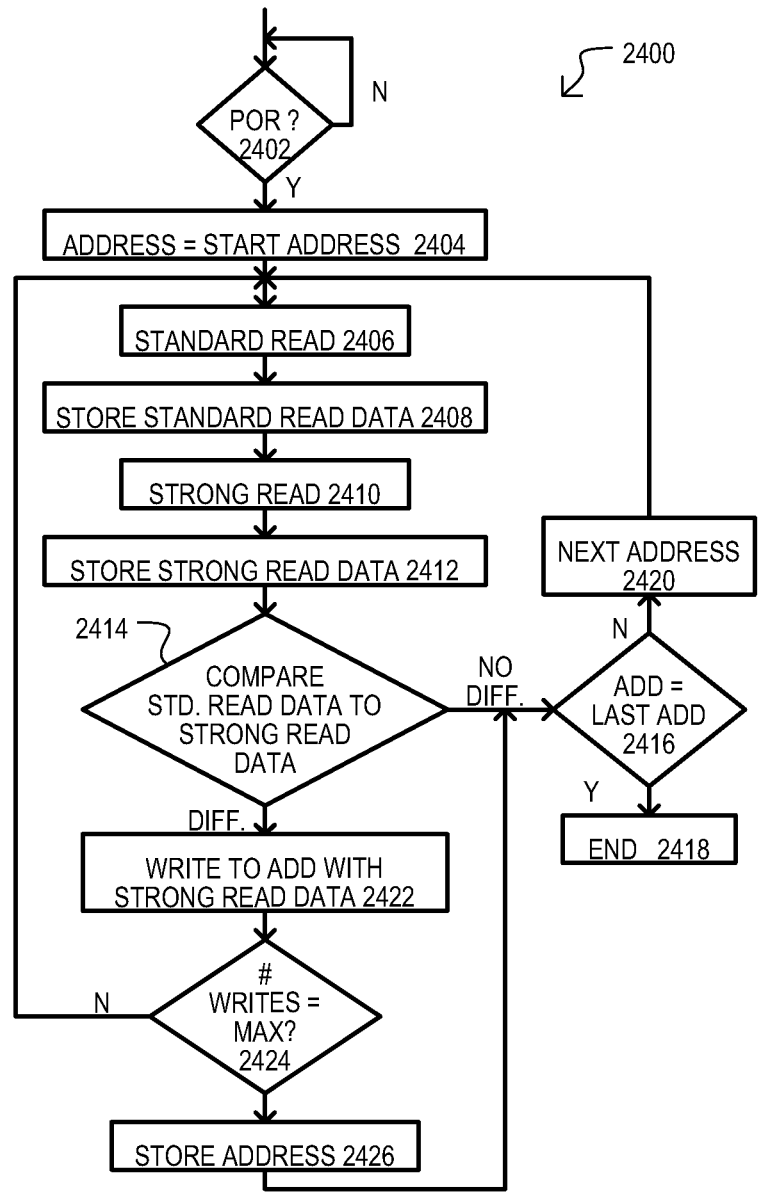
FIG. 24 is a flow diagram of a memory device according to another embodiment.

FIG. 24 is a flow diagram showing a method 2400 according to an embodiment. A method 2400 can utilize a strong read operation upon certain conditions (e.g., power-on/reset, wear, sitting time) to identify marginal bits for subsequent write operations.

A method 2400 can include determining if a condition (in this case power-on or reset, POR) exits (2402). If a POR condition exists (Y from 2404) an applied address can be set to a start address (2404). A standard read operation can then be performed (2406). A standard read operation can apply relatively lower energy conditions to read an element state. Read data generated from the standard read operation can then be stored (2408).

Following a standard read operation, a strong read operation can occur (2410). A strong read operation can apply relatively higher energy conditions to read an element state as compared to standard read conditions. Read data generated from the strong read operation can then be stored (2412).

Data generated from standard and strong read operations can then be compared to one another (2414). If there is no difference in such data values (NO DIFF. from 2414), a method 2400 can check to see of a last address has been reached (2416). If a last address is reached (Y from 2416), a method can end 2418. If a last address is not reached (N from 2416), a next address can be accessed (2420) and a method can return to box (2406).

If a difference exists between strong read and standard read data (DIFF. from 2414), a method 2400 can write strong read data to the address. A method 2400 can then check to see of a maximum number of writes to the address has been reached, which can indicate that write operations cannot enable a data value to be read with just a standard read operation. If a maximum number of write operations has not been reached (N from 2424), a method can return to box (2406).

If a maximum number of write operations has been reached (Y from 2424), an address for the location can be stored, and a method 2400 can proceed to box 2416. Thus, addresses of data locations that are not correctable with some number of write operations can be stored.

Figure 25:
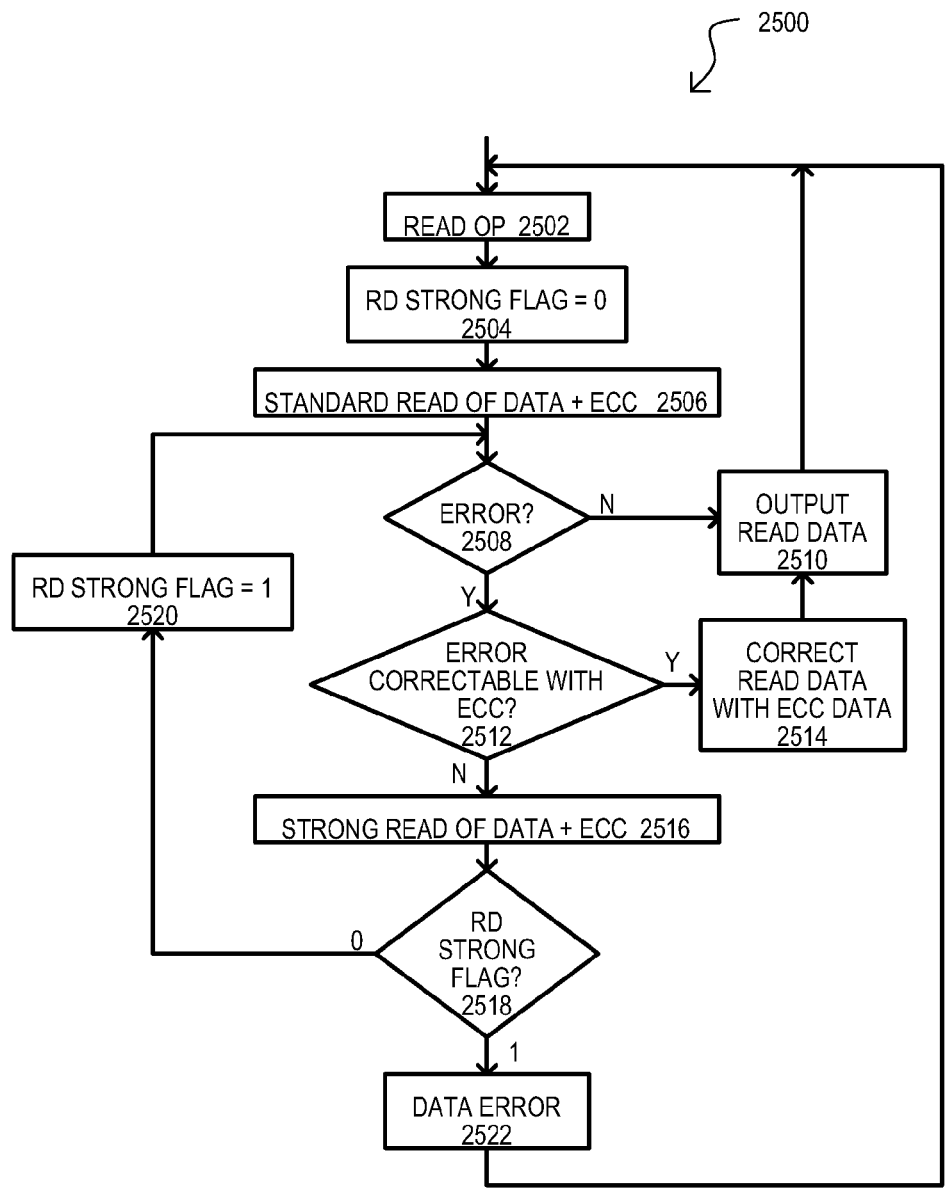
FIG. 25 is a flow diagram of a memory device according to another embodiment.

FIG. 25 shows another method 2500 according to another embodiment. A method 2500 can utilize a strong read operation to correct errors not correctable with an error correction code (ECC).

A method 2500 can include determining that a read operation has been requested 2502. A strong read flag can be set to an initial value (2504). A standard read operation can read data with corresponding ECC values (2506). A read data value can then be checked for an error (2508). If an error is not detected (N from 2508) the read data can be output (2510).

If an error is detected (Y from 2508), such data can be checked to determine if the error is correctable with ECC data (2512). If the error is correctable (Y from 2512), the error can be corrected with the ECC data 2514. Such error can then be output (2510).

If the error is not correctable with ECC data (N from 2512), a strong read operation of the same data and ECC can be performed (2516). A strong read flag can then be checked to see if a strong read has already be performed (2518). If a strong read has previously been performed ("1" from 2518), a data error can be indicated (2522) and a method 2500 can return to box 2502. If a strong read was not previously performed ("0" from 2518), a read strong flag can be set (2520). A method 2500 can then return to box 2508.

Multi-sense embodiments described herein use sense operations that determine a state of an element multiple times. That is, each sense operation yields a sense result for an element. This is in contrast to conventional sensing operations for multi-level elements that use multiple senses to determine one state. In such conventional embodiments, each sense operation yields only a partial determination of a data state. That is, a sense result (determination of element state) is not determined until after all sense operations are complete.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a sense circuit configured to generate a sense result by sensing a state of a memory element;
a store circuit configured to store a plurality of sense results generated at different times by the sense circuit for a same memory element; and
an evaluation circuit that generates an output value for the memory element in response to at least the plurality of sense results for the memory element stored in the store circuit.

2. The memory device of claim 1, wherein:
the sense circuit comprises a current sense amplifier that compares a current flowing through the memory element to at least one reference current to generate the sense result.

3. The memory device of claim 1, wherein:
the memory element comprises an ion conducting layer formed between two electrodes.

4. The memory device of claim 1, wherein:
the store circuit stores the sense results as digital values.

5. The memory device of claim 1, wherein:
the store circuit stores the sense results as analog values.

6. The memory device of claim 1, wherein:
the evaluation circuit is configured to generate an output value that corresponds to a majority state of the sense results, when the sense results vary from one another.

7. The memory device of claim 1, wherein:
the sense results comprise digital values; and
the evaluation circuit includes logic that generates the output value from the digital values.

8. The memory device of claim 1, wherein:
the evaluation circuit is further configured to activate a toggle indication when the plurality of sense results differ from one another.

9. The memory device of claim 8, further including:
a write circuit configured to write the generated output value to the memory element in response to activation of the toggle indication.

10. The memory device of claim 8, further including:
the sense circuit generates sense results for the memory element in response to address data corresponding to the memory element; and
a storage circuit configured to store the address data in response to activation of the toggle indication.

11. The memory device of claim 1, further including:
at least one reference element having a physical structure like that of the memory element; and
the sense circuit is configured to generate the sense result by comparing a reference value generated with the reference element to an output value generated by the memory element.

12. The memory device of claim 1, wherein:
the memory element is a multi-level element that represents more than two data states; and
each sense result generated by the sense circuit corresponds to one of the data states.

13. A method, comprising:
sensing a memory element state multiple times; and
generating a single output value in response to the multiple sensed states, the single output value varying in response to the multiple sensed states varying from one another in a predetermined fashion; wherein
sensing the memory element state includes sensing an impedance.

14. The method of claim 13, wherein:
sensing the memory element state includes sensing any characteristic selected from the group of: a resistance of the memory element; a voltage generated from the element; and a current generated from the element.

15. The method of claim 13, wherein:
sensing the memory element state includes sensing the impedance of a conductive bridging random access memory (CBRAM) element.

16. The method of claim 13, wherein:
sensing the memory element state multiple times includes generating a binary value for each time; and generating the single output value includes a logical operation on the binary values.

17. The method of claim 13, wherein:

sensing the memory element state multiple times includes generating an analog value from such multiple times; and generating the single output value includes generating a binary output value from the analog value.

18. The method device of claim 13, further including:

applying write conditions to the memory element corresponding to the single output value in response to the multiple sensed states varying from one another in a predetermined manner.

19. The method of claim 13, further including:

determining a majority element state from the multiple times, and applying the write conditions corresponding to the majority element state.

20. The method of claim 13, wherein:

sensing the memory element state multiple times includes sensing one of at least three different states each of the multiple times.

\* \* \* \* \*